United States Patent
Hosoda et al.

(10) Patent No.: US 10,126,657 B2
(45) Date of Patent: Nov. 13, 2018

(54) EXTREME ULTRAVIOLET LIGHT GENERATING APPARATUS

(71) Applicant: Gigaphoton Inc., Tochigi (JP)

(72) Inventors: Hirokazu Hosoda, Oyama (JP); Tamotsu Abe, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 15/971,073

(22) Filed: May 4, 2018

(65) Prior Publication Data
US 2018/0253010 A1    Sep. 6, 2018

Related U.S. Application Data

(63) Continuation of application No. PCT/JP2015/084978, filed on Dec. 14, 2015.

(51) Int. Cl.
| | |
|---|---|
| *H01J 37/00* | (2006.01) |
| *G03F 7/20* | (2006.01) |
| *H01J 37/32* | (2006.01) |
| *H05G 2/00* | (2006.01) |

(52) U.S. Cl.
CPC .... *G03F 7/70033* (2013.01); *H01J 37/32339* (2013.01); *H05G 2/008* (2013.01)

(58) Field of Classification Search
CPC . G03F 7/70033; H05G 2/008; H01J 37/32339
USPC .......................................... 250/493.1, 504 R
See application file for complete search history.

(56) References Cited

U.S. PATENT DOCUMENTS

| | | | |
|---|---|---|---|
| 8,705,035 B2 | 4/2014 | Ishihara et al. | |
| 9,131,589 B2 | 9/2015 | Hayashi et al. | |
| 9,198,272 B2 | 11/2015 | Nakano et al. | |
| 9,253,866 B2 | 2/2016 | Someya et al. | |
| 9,277,635 B2 | 3/2016 | Moriya et al. | |

(Continued)

FOREIGN PATENT DOCUMENTS

| | | | |
|---|---|---|---|
| JP | 2013-175434 A | 9/2013 | |
| JP | 2014-078394 A | 5/2014 | |

(Continued)

OTHER PUBLICATIONS

Written Opinion issued in corresponding International Application No. PCT/JP2015/084978; dated Mar. 1, 2016.

*Primary Examiner* — Michael Maskell
(74) *Attorney, Agent, or Firm* — Studebaker & Brackett PC

(57) ABSTRACT

An extreme ultraviolet light generating apparatus, may include: a chamber, in which extreme ultraviolet light is generated by plasma being generated in the interior thereof; a window provided in a wall of the chamber; a light source provided at the exterior of the chamber, configured to output illuminating light to the interior of the chamber via the window; a light sensor, configured to detect the illuminating light which is output to the interior of the chamber via the window; a shielding member having an opening that the illuminating light may pass through, that shields the window from emissions from the plasma, provided in the interior of the chamber; and a mirror provided along an optical path of the illuminating light in the interior of the chamber between the window and the shielding member, having a reflective surface that reflects the illuminating light, constituted by a surface of a metal layer.

17 Claims, 15 Drawing Sheets

(56) References Cited

U.S. PATENT DOCUMENTS

| | | | |
|---|---|---|---|
| 9,351,388 B2 | 5/2016 | Nakano et al. | |
| 9,468,082 B2 | 10/2016 | Hayashi et al. | |
| 2014/0098830 A1* | 4/2014 | Yabu | H05G 2/005 |
| | | | 372/30 |

FOREIGN PATENT DOCUMENTS

| | | |
|---|---|---|
| JP | 2014-154229 A | 8/2014 |
| JP | 2014-160670 A | 9/2014 |
| JP | 2014-186846 A | 10/2014 |
| JP | 2014-235805 A | 12/2014 |
| WO | 2014/042003 A1 | 3/2014 |

* cited by examiner

EXTREME ULTRAVIOLET LIGHT GENERATING APPARATUS

CROSS REFERENCE TO RELATED APPLICATIONS

The present application is a Continuation application of International Application No. PCT/JP2015/084978 filed on Dec. 14, 2015. The content of the application is incorporated herein by reference in its entirety.

BACKGROUND

1. Technical Field

The present disclosure is related to an extreme ultraviolet light generating apparatus.

2. Related Art

Recently, as semiconductor processes have become finer, transfer patterns for use in photolithography of semiconductor processes have also become finer. In the next generation, microfabrication at 20 nm or less will be in demand. In order to meet this demand, there is expectation for development of an exposure apparatus in which an extreme ultraviolet (EUV) light generating apparatus that generates extreme ultraviolet (EUV) light having a wavelength of approximately 13 nm is combined with a reduced projection reflective optic system.

Three types of EUV light generating apparatuses have been proposed. The three types are: an LPP (Laser Produced Plasma) type apparatus that employs plasma which is generated by a target substance being irradiated with a laser beam; a DPP (Discharge Produced Plasma) type apparatus that employs plasma which is generated by electrical discharge, and an SR (Synchrotron Radiation) type apparatus that employs synchrotron orbital radiation.

RELATED ART DOCUMENTS

Patent Documents

[Patent Document 1]
Japanese Unexamined Patent Publication No. 2013-175434
[Patent Document 2]
Japanese Unexamined Patent Publication No. 2014-154229
[Patent Document 3]
Japanese Unexamined Patent Publication No. 2014-160670

SUMMARY

An extreme ultraviolet light generating apparatus according to one aspect of the present disclosure may include: a chamber, in which extreme ultraviolet light is generated by plasma being generated in the interior thereof; a window provided in a wall of the chamber; a light source provided at the exterior of the chamber that outputs illuminating light to the interior of the chamber via the window; a light sensor that detects the illuminating light which is output to the interior of the chamber via the window; a shielding member having an opening that the illuminating light may pass through, that shields the window from emissions from the plasma, and is provided in the interior of the chamber; and a mirror provided along an optical path of the illuminating light in the interior of the chamber between the window and the shielding member, having a reflective surface that reflects the illuminating light, constituted by a surface of a metal layer.

BRIEF DESCRIPTION OF THE DRAWINGS

Embodiments of the present disclosure will be described below as examples, with reference to the attached drawings.

DETAILED DESCRIPTION OF EXEMPLARY EMBODIMENTS

Figure 1:
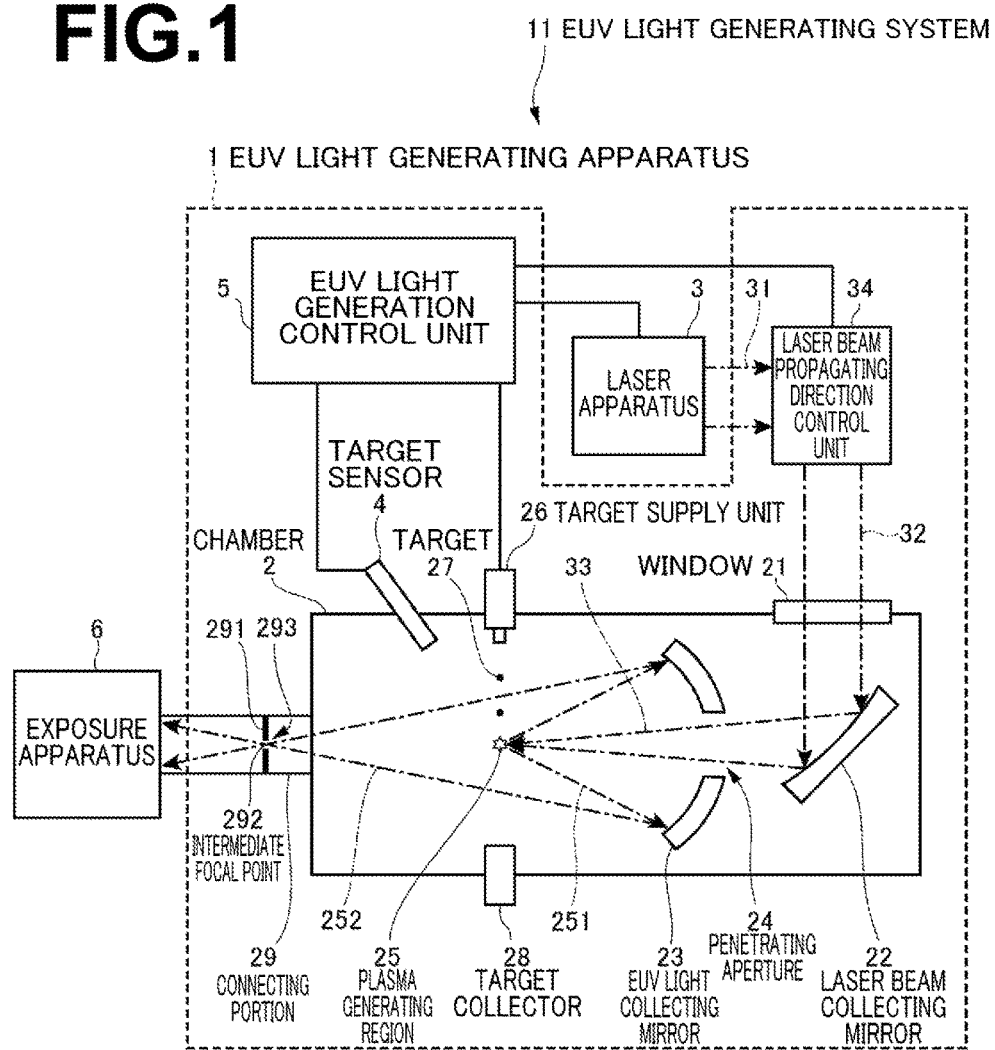
FIG. 1 is a diagram that schematically illustrates the configuration of an exemplary EUV light generating system of the LPP type.

<Contents->
1. Overview of EUV Light Generating System
   1.1 Configuration
   1.2 Operation
2. Terms
3. Problem
   3.1 Configuration of a Comparative Example
   3.2 Operation of the Comparative Example
   3.3 Problem 4. First Embodiment
   4.1 Configuration
   4.2 Operation
   4.3 Functions and Effects
   4.4 First Modification
   4.5 Second Modification
   4.6 Third Modification
   4.7 Fourth Modification
5. Second Embodiment
   5.1 Configuration
   5.2 Operation, Functions, and Effects
6. Third Embodiment
   6.1 Configuration
   6.2 Operation, Functions, and Effects
7. Fourth Embodiment
   7.1 Configuration
   7.2 Operation, Functions, and Effects
8. Fifth Embodiment
   8.1 Configuration
   8.2 Operation, Functions, and Effects
   8.3 First Modification
   8.4 Second Modification
9. Sixth Embodiment
   9.1 Configuration
   9.2 Operation, Functions, and Effects
10. Seventh Embodiment
   10.1 Configuration
   10.2 Operation, Functions, and Effects
11. Eighth Embodiment
   11.1 Configuration
   11.2 First Modification
12. Ninth Embodiment
   12.1 Configuration
   12.2 First Modification
13. Other Items
   13.1 Other Modifications, etc.

Hereinafter, embodiments of the present disclosure will be described in detail while referring to the attached drawings. The embodiments to be described below are illustrative examples of the present disclosure, and do not limit the scope of the present disclosure. In addition, not all of the configurations and operations of the embodiments to be described below are necessarily essential configurations and operations of the present disclosure. Note that common constituent elements will be denoted by the same reference numerals, and redundant descriptions will be omitted.

1. Overview of EUV Light Generating System

[1.1 Configuration]

FIG. 1 is a diagram that schematically illustrates the configuration of an exemplary EUV light generating system of the LPP type.

An EUV light generating apparatus 1 may be employed with at least one laser apparatus 3. A system that includes the EUV light generating apparatus 1 and the laser apparatus 3 will be referred to as an EUV light generating system 11. As illustrated in FIG. 1 and as will be described in detail later, the EUV light generating apparatus 1 may include a chamber 2 and a target supply unit 26. The chamber 2 may be sealable. The target supply unit 26 may be provided such that it penetrates through a wall of the chamber 2, for example. The material which is supplied by the target supply unit 26 as a target 27 may include tin, terbium, gadolinium, lithium, xenon, or any combination including two or more thereof, but is not limited to these materials.

A wall of the chamber 2 may have at least one penetrating aperture therethrough. A window 21 may be provided at the penetrating aperture. A pulsed laser beam 32 which is output from the laser apparatus 3 may pass through the window 21. An EUV light collecting mirror 23 having a spheroidal reflective surface, for example, may be provided in the chamber 2. The EUV light collecting mirror 23 may have a first focal point and a second focal point. The surface of the EUV light collecting mirror 23 may have a multi layered reflective film, in which molybdenum layers and silicon layers are alternately laminated, formed thereon, for example. It is preferable for the EUV light collecting mirror 23 to be provided such that the first focal point is positioned in a plasma generating region 25, and the second focal point is positioned at an intermediate focal point (IF) 292. The EUV light collecting mirror 23 may have a penetrating aperture 24 formed in the center thereof, and a pulsed laser beam 33 may pass through the penetrating aperture 24.

The EUV light generating apparatus 1 may include an EUV light generation control unit 5, a target sensor 4, and the like. The target sensor 4 may have an image capturing function, and may be configured to detect the presence, the trajectory, the position, the velocity, etc. of the target 27.

In addition, the EUV light generating apparatus 1 may include a connecting portion 29 that causes the interior of the chamber 2 to be in communication with the interior of an exposure apparatus 6. A wall 291 having an aperture 293 formed therein may be provided within the connecting portion 29. The wall 291 may be provided such that the aperture 293 is positioned at the second focal point of the EUV light collecting mirror 23.

Further, the EUV light generating apparatus 1 may include a laser beam propagating direction control unit 34, a laser beam collecting mirror 22, a target collector 28 configured to collect the target 27, and the like. The laser beam propagating direction control unit 34 may be equipped with an optical element for regulating the propagating direction of a laser beam, and an actuator for adjusting the position, orientation, etc. of the optical element.

[1.2 Operation]

Referring to FIG. 1, a pulsed laser beam 31 which is output from the laser apparatus 3 may propagate via the laser beam propagating direction control unit 34, pass through the window 21 as the pulsed laser beam 32, and then enter the chamber 2. The pulsed laser beam 32 may propagate through the chamber 2 along at least one laser beam path, be reflected by the laser beam collecting mirror 22, and be radiated to at least one target 27 as the pulsed laser beam 33.

The target supply unit 26 may be configured to output the target 27 toward the plasma generating region 25 in the interior of the chamber 2. The target 27 may be irradiated with at least one pulse which is included in the pulsed laser beam 33. The target 27 which is irradiated with the pulsed laser beam 33 turns into plasma, and EUV light 251 is radiated accompanying radiation of light having other wavelengths. The EUV light 251 may be selectively reflected by the EUV light collecting mirror 23. EUV light 252 which is reflected by the EUV light collecting mirror 23 may be focused at the intermediate focal point 292 and output to the exposure apparatus 6. Note that a single target 27 may be irradiated with a plurality of pulses which are included in the pulsed laser beam 33.

The EUV light generation control unit 5 may be configured to totally control the entire EUV light generating system 11. The EUV light generation control unit 5 may be configured to process image data or the like of the target 27 captured by the target sensor 4. The EUV light generation control unit 5 may control at least one of the timing at which the target 27 is output, the output direction of the target 27, and the like, for example. The EUV light generation control unit 5 may further control at least one of the output timing of the laser apparatus 3, the propagating direction of the pulsed laser beam 32, the focal position of the pulsed laser beam 33, and the like, for example. The above items which are controlled are merely examples, and other additional items may be controlled as necessary.

2. Terms

A "target" refers to a substance which is introduced into a chamber and is irradiated with a laser beam. The target which is irradiated with the laser beam turns into plasma and emits EUV light.

A "droplet" refers to one form in which the target is supplied into the chamber.

A "plasma generating region" refers to a predetermined region within the chamber. The plasma generating region is a region in which the target which is output into the chamber is irradiated with the laser beam, and the target turns into plasma.

A "droplet trajectory" is a path that a droplet which is output to the interior of the chamber travels along. The droplet trajectory may intersect the optical path of the laser beam which is introduced to the interior of the chamber, at the plasma generating region.

An "axis of an optical path" refers to an axis that passes through the center of the cross section of a laser beam along the direction in which the laser beam propagates.

An "optical path" refers to a path through which the laser beam passes. The optical path may include the axis of the optical path.

A "Z axis direction" is a direction in which the EUV light generating apparatus outputs EUV light to the exposure apparatus.

A "Y axis direction" is a direction in which the target supply unit outputs droplets to the interior of the chamber.

An "X axis direction" is a direction that perpendicularly intersects the Y axis direction and the Z axis direction.

3. Problem

An EUV light generating apparatus 1 of a comparative example will be described with reference to FIG. 2 and FIG. 3.

The EUV light generating apparatus 1 of the comparative example may be an EUV light generating apparatus 1 that includes a droplet detector 41.

[3.1 Configuration of a Comparative Example]

Figure 2:
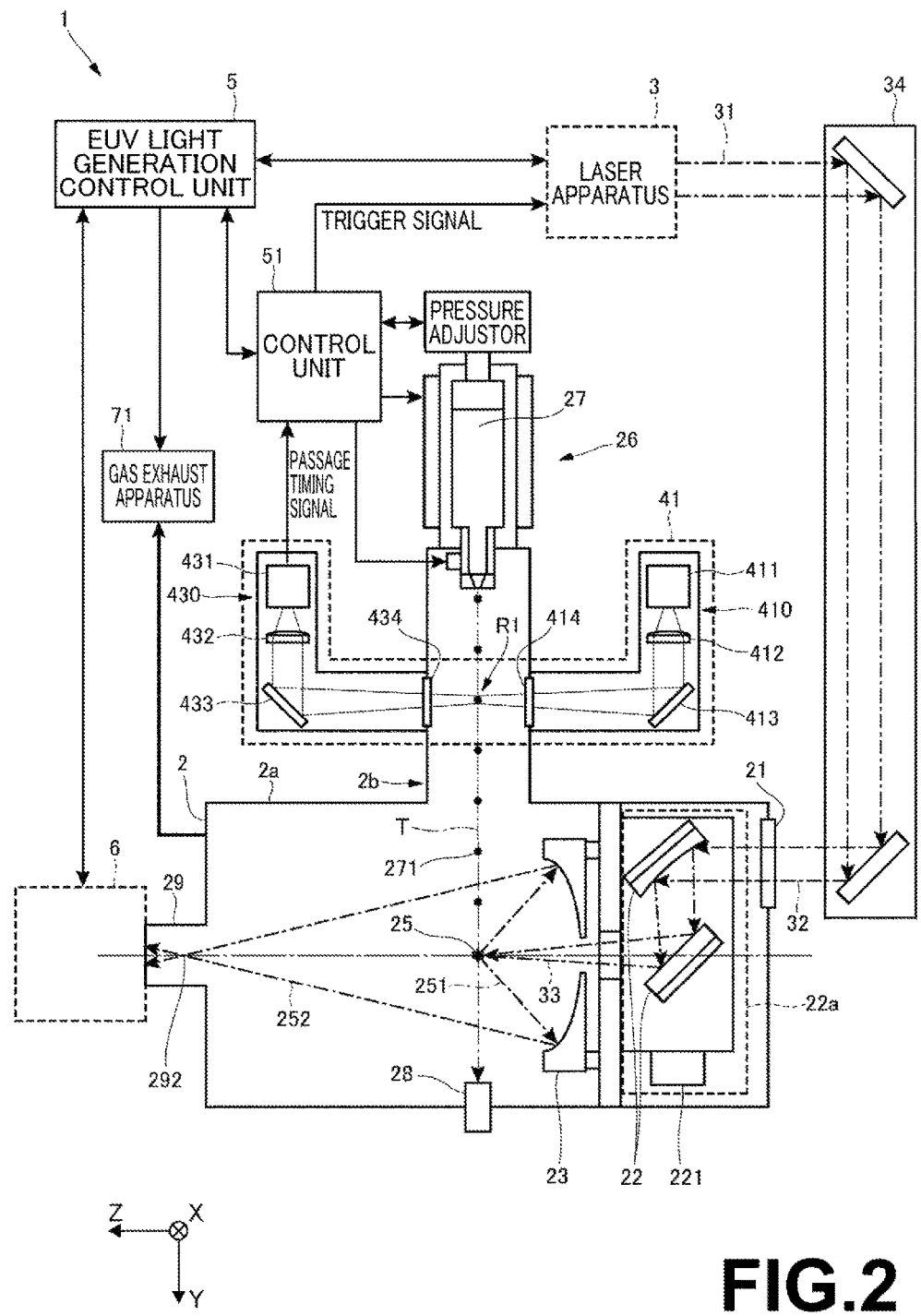
FIG. 2 is a diagram for explaining the configuration of an EUV light generating apparatus of a comparative example.

FIG. 2 is a diagram for explaining the configuration of the EUV light generating apparatus 1 of the comparative example.

The EUV light generating apparatus 1 of the comparative example may be an apparatus which is utilized together with a laser apparatus 3 that outputs the pulsed laser beam 31.

The EUV light generating apparatus 1 of the comparative example may be equipped with the chamber 2, the laser beam propagating direction control unit 34, a gas exhaust apparatus 71, the target supply unit 26, the target collector 28, the droplet detector 41, the EUV light generation control unit 5, and a control unit 51.

As described above, the chamber 2 may be a container into which a droplet 271 is supplied by the target supply unit 26 and within which the droplet 271 is irradiated with the pulsed laser beam 33 to generate plasma and to generate the EUV light 252.

A wall 2a of the chamber 2 may form an interior space of the chamber 2 and partition the interior space of the chamber 2 from the exterior.

The chamber 2 may be formed to be of a hollow cylindrical shape, for example. The direction of the central axis of the cylindrically shaped chamber 2 may be substantially parallel to the Z axis direction.

The chamber 2 may include a target supply channel 2b for supplying a droplet 271 from the exterior of the chamber 2 to the interior of the chamber 2.

The target supply channel 2b may be formed to be of a hollow cylindrical shape. The direction of the central axis of the cylindrically shaped target supply channel 2b may be substantially perpendicular to the Z axis direction.

A laser beam optical system 22a and the EUV light collecting mirror 23 may be provided in the interior of the chamber 2.

The laser beam collecting optical system 22a may include the laser beam collecting mirror 22 and a triaxial stage 221.

The laser beam collecting mirror 22 may reflect the pulsed laser beam 32 which passes through the window 21 and enters therein. The laser beam collecting mirror 22 may focus the reflected pulsed laser beam 32 at the plasma generating region 25 as the pulsed laser beam 33.

The laser beam collecting mirror 22 may be mounted on the triaxial stage 221.

The triaxial stage 221 may be a stage that adjusts at least one of the position and the orientation of the laser beam collecting mirror 22 in three axis directions, the X axis direction, the Y axis direction, and the Z axis direction.

The operation of the triaxial stage 221 may be controlled by the EUV light generation control unit 5.

The EUV light collecting mirror 23 may selectively reflect the EUV light 251 in the vicinity of a specific wavelength included in the EUV light 251 which is generated in the plasma generating region 25. The EUV light collecting mirror 23 may focus the selectively reflected EUV light 251 at the intermediate focal point 292 as the EUV light 252.

The laser beam propagating direction control unit 34 may control the propagating direction of the pulsed laser beam 31 such that the pulsed laser beam 31 which is output from the laser apparatus 3 passes through the window 21 as the pulsed laser beam 32.

The operation of the laser beam propagating direction control unit 34 may be controlled by the EUV light generation control unit 5.

The gas exhaust apparatus 71 may be an apparatus that suctions gas from the interior of the chamber 2 until the pressure in the interior of the chamber 2 becomes a pressure close to a vacuum, and exhausts the suctioned gas to the exterior of the chamber 2.

The operation of the gas exhaust apparatus 71 may be controlled by the EUV light generation control unit 5.

The target supply unit 26 may be a device that melts the target 27 to be supplied to the interior of the chamber 2, and outputs the target 27 toward the plasma generating region 25 in the interior of the chamber 2 as the droplet 271. The target supply unit 26 may be a device that outputs the droplet 271 by the so called continuous jet method.

The target 27 which is supplied by the target supply unit 26 may be formed by a metal material. The metal material that forms the target 27 may be tin, terbium, gadolinium, or any combination including two or more thereof. Preferably, the metal material that forms the target 27 may be tin.

The target supply unit 26 may be provided at an end portion of the target supply channel 2b of the chamber 2.

The operation of the target supply unit 26 may be controlled by the control unit 51.

The target collector 28 may be a device that collects droplets 271 which are not irradiated with the pulsed laser beam 33, from among the droplets 271 which are output to the interior of the chamber 2.

The target collector 28 may be provided on a wall 2a of the chamber 2 along a line that extends from a droplet trajectory T.

The droplet detector 41 may be a detector that detects the droplet 271 which is output to the interior of the chamber 2.

Specifically, the droplet detector 41 may be a detector that detects a timing at which the droplet 271 passes through a predetermined first region R1, which is a predetermined position in the interior of the chamber 2. The predetermined position at which the first region R1 is located may be a position along the droplet trajectory T between the target supply unit 26 and the plasma generating region 25.

The droplet detector 41 may include an illuminating unit 410 and a light receiving unit 430.

The illuminating unit 410 and the light receiving unit 430 may be connected to the outer side of the wall 2a of the chamber 2. The illuminating unit 410 and the light receiving unit 430 may be connected to the wall 2a of the target supply channel 2b, which is a portion of the chamber 2.

The illuminating unit 410 and the light receiving unit 430 may be arranged such that they face each other with the first region R1 along the droplet trajectory T interposed therebetween. The direction along which the illuminating unit 410 and the light receiving unit 430 face each other may substantially perpendicularly intersect the droplet trajectory T.

Note that in FIG. 2 and FIG. 7 to be described later, the direction along which the illuminating unit 410 and the light receiving unit 430 face each other is illustrated to be the Z axis direction for the sake of convenience, but direction along which the illuminating unit 410 and the light receiving unit 430 face each other is not limited to such a direction. The direction along which the illuminating unit 410 and the light receiving unit 430 face each other may be a direction which is substantially parallel to an XZ plane. The direction along which the illuminating unit 410 and the light receiving unit 430 face each other may be a direction which is inclined with respect to the XZ plane.

The illuminating unit 410 may output illuminating light to the first region R1 in the interior of the chamber 2.

The illuminating unit 410 may include a light source 411, an illuminating optical system 412, a first mirror 413, and a first window 414.

The light source 411 may be a light source for the illuminating light which is output to the first region R1 via the first window 414. The illuminating light which is output to the first region R1 may illuminate the droplet 271 that passes through the first region R1. In other words, the light source 411 may output the illuminating light so as to illuminate the droplet 271 that passes through the first region R1.

The light source 411 may be a light source that outputs continuous light of a single wavelength, such as a CW (Continuous Wave) laser. Alternatively, the light source 411 may be a light source that outputs continuous light having a plurality of wavelengths, such as a lamp. As a further alternative, the light source 411 may be a light source that periodically outputs pulsed light.

The operation of the light source 411 may be controlled by the control unit 51.

The illuminating optical system 412 may be an optical system that includes a light collecting lens and the like. The light collecting lens may be a cylindrical lens, for example.

The illuminating optical system 412 may be provided along an optical path of the illuminating light which is output from the light source 411.

The illuminating optical system 412 may transmit the illuminating light which is output from the light source 411, and guide the transmitted illuminating light to the first mirror 413. The illuminating optical system 412 may focus the illuminating light, which is output from the light source 411, at the first region R1, via the first mirror 413 and the first window 414.

The illuminating optical system 412 may shape the profile of the illuminating light which is output from the light source 411 such that the illuminating light which is focused at the first region R1 has a predetermined profile. The predetermined profile may be a profile that matches the field of view of a light sensor 431 at the first region R1, which is necessary to detect the droplet 271 that passes through the first region R1.

The first mirror 413 may be provided along an optical path of the illuminating light which is transmitted through the illuminating optical system 412. The first mirror 413 may be arranged to respectively face the illuminating optical system 412 and the first window 414.

The first mirror 413 may reflect the illuminating light, which is transmitted through the illuminating optical system 412, toward the first window 414.

The first window 414 may be provided in the wall 2a of the target supply channel 2b, which is a portion of the chamber 2. The first window 414 may be mounted in the wall 2a via a sealing member such that the pressure in the interior of the chamber 2 is maintained at a pressure approximating a vacuum.

The first window 414 may be provided along an optical path of the illuminating light which is reflected by the first mirror 413. The first window 414 may be arranged to face the first region R1.

The first window 414 may transmit the illuminating light, which is reflected by the first mirror 413, toward the first region R1.

The light receiving unit 430 may receive the illuminating light which is output to the first region R1.

The light receiving unit 430 may include the light sensor 431, a light receiving optical system 432, a second mirror 433, and a second window 434.

The second window 434 may be provided in the wall 2a of the target supply channel 2b, which is a portion of the chamber 2. The second window 434 may be mounted in the wall 2a via a sealing member such that the pressure in the interior of the chamber 2 is maintained at a pressure approximating a vacuum.

The second window 434 may be arranged to face the first window 414 of the illuminating unit 410 with the first region R1 interposed therebetween.

The second window 434 may be provided along an optical path of the illuminating light which is output to the first region R1.

The second window 434 may transmit the illuminating light, which output to the first region R1, toward the second mirror 433.

The second mirror 433 may be provided along an optical path of the illuminating light which is transmitted through the second window 434. The second mirror 433 may be arranged to respectively face the light receiving optical system 432 and the second window 434.

The second mirror 433 may reflect the illuminating light which is transmitted through the second window 434 toward the light receiving optical system 432.

The light receiving optical system 432 may be constituted by a transfer optical system in which a plurality of lenses, etc. are combined.

The light receiving optical system 432 may be provided along an optical path of the illuminating light which is reflected by the second mirror 433.

The light receiving optical system 432 may transmit the illuminating light which is reflected by the second mirror 433, and guide the illuminating light to the light sensor 431. The light receiving optical system 432 may transfer an image at the first region R1 of the illuminating light which is output to the first region R1 to a light receiving surface of the light sensor 431.

The light sensor 431 may be a light sensor that detects the illuminating light which is output to the first region R1 via the first window 414. In other words, the light sensor 431 may detect the illuminating light, which is output to illuminate the droplet 271 that passes through the first region R1.

The light sensor 431 may be a light sensor having a single channel. Alternatively, the light sensor 431 may be a light sensor having a plurality of channels which are arranged one-dimensionally or two-dimensionally.

The light sensor 431 may be constituted by including light receiving elements such as a photodiode array.

The light sensor 431 may be provided along an optical path of the illuminating light which passes through the light receiving optical system 432.

The light sensor 431 may detect the light intensity represented by the image of the illuminating light which is transferred by the light receiving optical system 432 with the light receiving element included in the light sensor 431, and may send a detection signal corresponding to the light intensity to the control unit 51.

The EUV light generation control unit 5 may send and receive various signals to and from the exposure apparatus 6.

The EUV light generation control unit 5 may totally control the operations of the constituent elements of the EUV light generating system 11, based on various signals received from the exposure apparatus 6.

The EUV light generation control unit 5 may send and receive control signals to and from the laser apparatus 3. Thereby, the EUV light generation control unit 5 may control the operation of the laser apparatus 3.

The EUV light generation control unit 5 may send and receive control signals to and from each of the laser beam propagating direction control unit 34 and the triaxial stage 221. Thereby, the EUV light generation control unit 5 may control the propagating directions and collecting positions of the pulsed laser beams 31 through 33.

The EUV light generation control unit 5 may send and receive control signals to and from the gas exhaust apparatus 71. Thereby, the EUV light generation control unit 5 may control the pressure in the interior of the chamber 2.

The EUV light generation control unit 5 may send and receive control signals to and from the control unit 51. Thereby, the EUV light generation control unit 5 may indirectly control the operations of the constituent elements included in the target supply unit 26 and the droplet detector 41.

The control unit 51 may send and receive various signals to and from the EUV light generation control unit 5.

The control unit 51 may control the operations of the constituent elements included in the target supply unit 26 and the droplet detector 41, based on control signals which are received from the EUV light generation control unit 5.

In addition, the control unit 51 may control the timing at which the laser apparatus 3 outputs the pulsed laser beam 31, based on the control signals which are received from the EUV light generation control unit 5.

[3.2 Operation of the Comparative Example]

The target supply unit 26 may output the droplet 271 toward the plasma generating region 25 in the interior of the chamber 2, according to control from the control unit 51.

The droplet 271 which is output to the interior of the chamber 2 may travel along the droplet trajectory T, and pass through the first region R1.

The light source 411 which is included in the droplet detector 41 may output the illuminating light to the first region R1 according to control from the control unit 51 so as to illuminate the droplet 271 that passes through the first region R1.

The light sensor 431 which is included in the droplet detector 41 may detect the illuminating light which is output so as to illuminate the droplet 271 that passes through the first region R1.

In the case that the droplet 271 that travels along the droplet trajectory T passes through the first region R1, the illuminating light which is output from the light source 411 illuminates the droplet 271 that passes through the first region R1, and propagates toward the light sensor 431. At this time, a portion of the illuminating light that propagates toward the light sensor 431 may be shielded by the droplet 271.

For this reason, in the case that the droplet 271 passes through the first region R1, a portion of the image of the illuminating light, which is output from the light source 411, at the first region R1 may be transferred to the light sensor 431 as an image of a shadow of the droplet 271 that passes through the first region R1. In other words, in the case that the droplet 271 passes through the first region R1, the light sensor 431 may detect the illuminating light which is not shielded by the droplet 271 and passes the periphery thereof, of the illuminating light which is output so as to illuminate the droplet 271.

Accordingly, in the case that the droplet 271 passes through the first region R1, the light intensity of the illuminating light which is detected by the light sensor 431 will decrease significantly compared to a case that the droplet 271 is not passing through the first region R1.

The light sensor 431 may convert the light intensity of the detected illuminating into a voltage value, generate a detection signal that corresponds to a change in the light intensity, and send the generated detection signal to the control unit 51.

Note that the detection signal that corresponds to the change in the light intensity which is generated by the light sensor 431 will also be referred to as a passage timing signal.

The control unit 51 may receive the passage timing signal from the light sensor 431.

The control unit 51 may generate a droplet detection signal at a timing at which the passage timing signal falls below a predetermined threshold value.

The droplet detection signal may be a signal that indicates that a droplet 271 which has passed through the first region R1 has been detected.

The control unit 51 may send a trigger signal to the laser apparatus 3 at a timing which is delayed from the timing at which the droplet detection signal is generated by a delay time.

The trigger signal may be a signal that provides momentum for the laser apparatus 3 to output the pulsed laser beam 31.

The delay time may be an amount of time that causes a timing at which the pulsed laser beam 33 reaches the plasma generating region 25 to substantially match a timing at which the droplet 271 reaches the plasma generating region 25. The delay time may be stored in the control unit 51 in advance.

When the laser apparatus 3 receives the trigger signal, the laser apparatus 3 may output the pulsed laser beam 31. The pulsed laser beam 31 which is output from the laser apparatus 3 may be introduced to the interior of the chamber 2 as the pulsed laser beam 32 via the laser beam propagating direction control unit 34 and the window 21.

The pulsed laser beam 32 which is introduced to the interior of the chamber 2 may be collected by the laser beam collecting optical system 22a and guided to the plasma generating region 25 as the pulsed laser beam 33. The pulsed laser beam 33 may be guided to the plasma generating region 25 at the timing at which the droplet 271 reaches the plasma generating region 25.

The pulsed laser beam 33 which is guided to the plasma generating region 25 may irradiate the droplet 271 which has reached the plasma generating region 25. The droplet 271 which is irradiated with the pulsed laser beam 33 may generate plasma. The generated plasma may radiate light that includes the EUV light 251. The EUV light 251 in the vicinity of a specific wavelength from the radiated EUV light 251 may be selectively reflected by the EUV light collecting mirror 23. The selectively reflected EUV light 251 may be focused at the intermediate focal point 292 as the EUV light 252, and then be output to the exposure apparatus 6.

[3.3 Problem]

Figure 3:
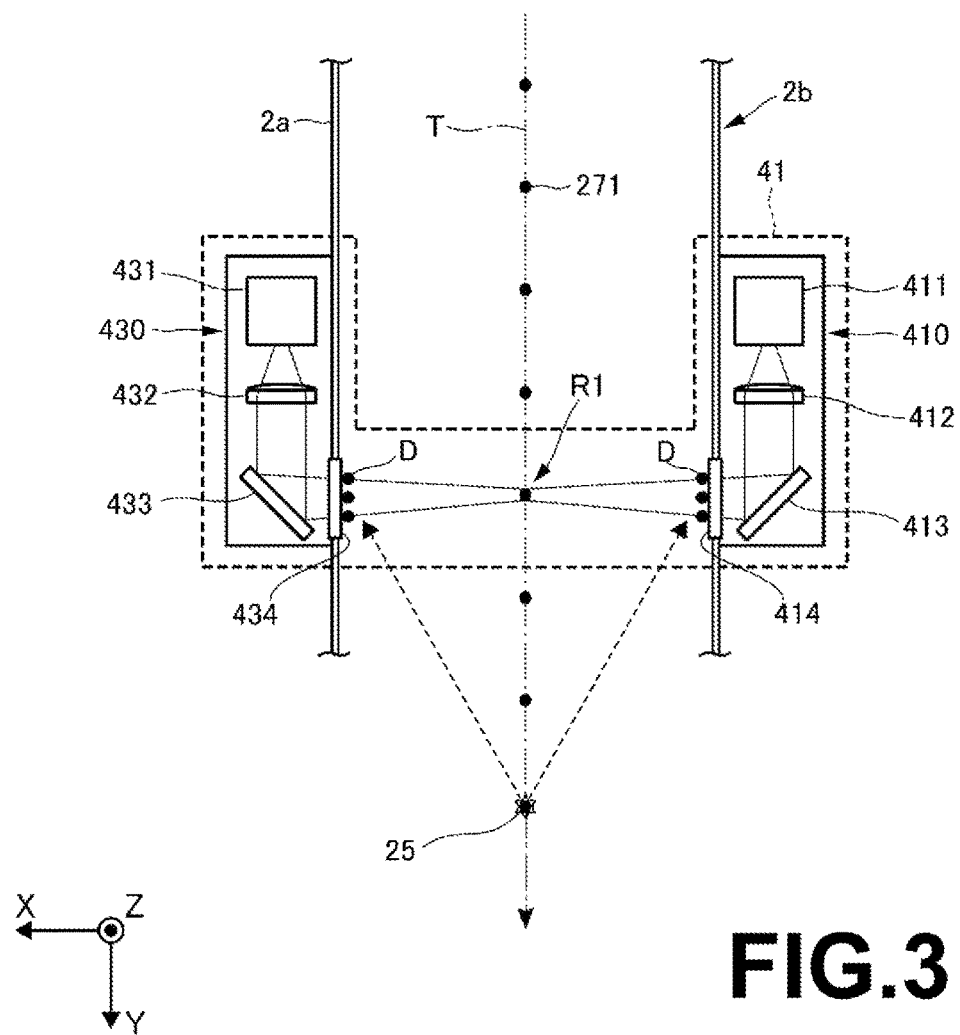
FIG. 3 is a diagram for explaining a problem of the EUV generating apparatus of the comparative example.

FIG. 3 is a diagram for explaining a problem of the EUV light generating apparatus 1 of the comparative example.

As described above, the droplet 271 which has reached the plasma generating region 25 may generate plasma when it is irradiated with the pulsed laser beam 33.

At this time, the plasma may emit atoms, clusters, ions, etc. of the target 27, in addition to the EUV light 251.

Energy is imparted to the atoms, clusters, ions, etc. of the target 27 which are emitted from the plasma by the pulsed laser beam 33, and therefore the atoms, clusters, ions, etc. of the target 27 may have a high amount of kinetic energy. For this reason, the atoms, clusters, ions, etc. of the target 27 which are emitted from the plasma may scatter from the plasma generating region 25 toward the wall 2a of the chamber 2 and the like at high speed. A portion of the atoms, clusters, ions, etc. of the target 27 which are emitted from the plasma may adhere to the first and second windows 414 and 434 of the droplet detector 41.

Note that the atoms, clusters, ions, etc. of the target 27 which are emitted from the plasma will also be collectively referred to as emissions from the plasma.

Among the emissions from the plasma, emissions adhered to the constituent elements of the droplet detector 41 such as the first and second windows 414 and 434 will also be referred to as debris D.

In the case that the debris D becomes adhered to the first and second windows 414 and 434, thin films will form on the surfaces of the first and second windows 414 and 434, and the transmissivity of the first and second windows 414 and 434 may decrease. Thereby, the amount of the illuminating light which is detected by the light sensor 431 may decrease, and appropriate passage timing signals may not be output.

Particularly in this case, the difference between the light intensity which is detected by the light sensor 431 when the droplet 271 passes through the first region R1 and the light intensity which is detected when the droplet 271 is not passing through the first region R1 may become small, and appropriately judging whether the droplet 271 has passed through the first region R1 may become difficult. In other words, the contrast of the illuminating light which is detected by the light sensor 431 may decrease, and appropriately judging whether the droplet 271 has passed through the first region R1 may become difficult.

In this manner, a deterioration in the detection accuracy of the droplet detector 41 or an inability of the droplet detector 41 to perform detection may result, by the debris D adhering to the first and second windows 414 and 434.

Accordingly, a technique which is capable of improving the detection accuracy of the droplet detector 41 by suppressing adhesion of the debris D onto the first and second windows 414 and 434 is desired.

4. First Embodiment

An EUV light generating apparatus 1 according to a first embodiment will be described with reference to FIG. 4 through FIG. 6.

The EUV light generating apparatus 1 of the first embodiment may be equipped with first and second mirrors 415 and 435 instead of the first and second mirrors 413 and 433 of the EUV light generating apparatus 1 of the comparative example. Further, the EUV light generating apparatus 1 of the first embodiment may be of a configuration which is additionally equipped with first and second shielding members 416 and 436 compared to the EUV light generating apparatus 1 of the comparative example.

Descriptions of the structures of the EUV light generating apparatus 1 of the first embodiment which are the same as those of the EUV light generating apparatus 1 of the comparative example will be omitted.

[4.1 Configuration]

Figure 4:
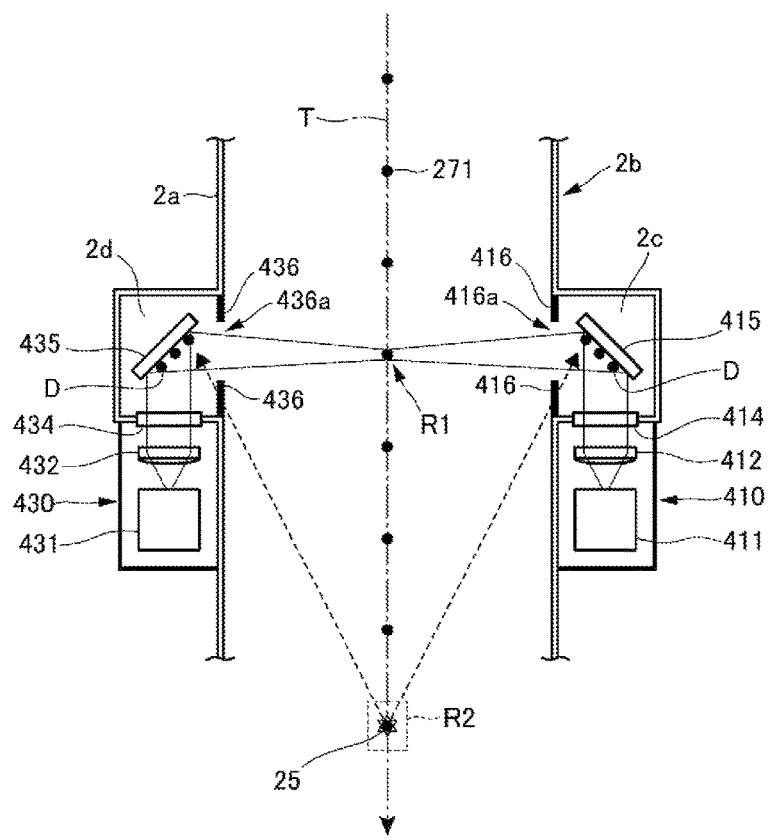
FIG. 4 is a diagram for explaining the configuration of an EUV light generating apparatus according to a first embodiment.

FIG. 4 is a diagram for explaining the configuration of the EUV light generating apparatus 1 of the first embodiment.

A first protruding portion 2c and a second protruding portion 2d may be formed on the chamber 2 of the first embodiment.

The first and second protruding portions 2c and 2d may respectively be formed to cause the wall 2a of the target supply channel 2b, which is a portion of the chamber 2, to protrude outwardly.

The interior spaces of the first and second protruding portions 2c and 2d may respectively be in communication with the interior space of the target supply channel 2b. In other words, the interior spaces of the first and second protruding portions 2c and 2d may respectively be a portion of the interior space of the target supply channel 2b, that is, the interior space of the chamber 2.

The first and second protruding portions 2c and 2d may be formed such that they face each other with the first region R1 along the droplet trajectory T interposed therebetween. The direction along which the first protruding portion 2c and the second protruding portion 2d face each other may substantially perpendicularly intersect the droplet trajectory T.

The first protruding portion 2c and the second protruding portion 2d may be arranged at positions that intersect a plane that intersects the droplet trajectory T and includes the first region R1. The plane that intersects the first protruding portion 2c and the second protruding portion 2d may be a plane which is substantially parallel to the XZ plane.

The illuminating unit 410 of the first embodiment may be provided in the first protruding portion 2c.

The illuminating unit 410 of the first embodiment may include the light source 411, the illuminating optical system 412, the first window 414, the first mirror 415, and the first shielding member 416.

In the illuminating unit 410 of the first embodiment, the light source 411, the illuminating optical system 412, the first window 414, the first mirror 415, and the first shielding member 416 may be provided in this order on the optical path of the illuminating light in the direction in which the illuminating light propagates. That is, the order in which the constituent elements of the illuminating unit 410 of the first embodiment are arranged may be that in which the arrangement order of the first window 414 and the first mirror 415 of the illuminating unit 410 of the comparative example are reversed.

The light source 411 of the first embodiment may be provided outside the wall 2a that forms the first protruding portion 2c. That is, the light source 411 may be provided at the exterior of the chamber 2.

The light source 411 may be provided apart from the wall 2a that forms the first protruding portion 2c.

The light source 411 may be arranged to face the first window 414 provided in the wall 2a that forms the first protruding portion 2c, via the illuminating optical system 412.

The illuminating optical system 412 of the first embodiment may be provided outside the wall 2a that forms the first protruding portion 2c. That is, the illuminating optical system 412 may be provided at the exterior of the chamber 2.

The illuminating optical system 412 may be provided apart from the wall 2a that forms the first protruding portion 2c.

The illuminating optical system 412 may be provided between the first window 414 which is provided in the wall 2a that forms the first protruding portion 2c and the light source 411.

The illuminating optical system 412 may transmit the illuminating light which is output from the light source 411 and guide the transmitted illuminating light to the first window 414.

The first window 414 of the first embodiment may be provided in the wall 2a that forms the first protruding portion 2c. The first window 414 may be provided in the surface of the wall 2a that forms the first protruding portion 2c on the side close to the plasma generating region 25.

The first window 414 may be provided closer to the plasma generating region 25 in a direction along the droplet trajectory T than the first mirror 415 is.

The first window 414 may be provided along the optical path of the illuminating light which is transmitted through the illuminating optical system 412.

The first window 414 may transmit the illuminating light which is transmitted through the illuminating optical system 412 toward the interior of the first protruding portion 2c.

The first mirror 415 of the first embodiment may be configured to have a high reflectance with respect to the wavelength of the illuminating light. The surface roughness of a reflective surface of the first mirror 415 may be that having a maximum height Rz (JIS B 0601:2001) of 30 nm or greater and 60 nm or less, for example.

The first mirror 415 may be provided in the interior of the first protruding portion 2c. That is, the first mirror 415 may be provided in the interior of the chamber 2.

The first mirror 415 may be provided at a position that intersects the plane that intersects the droplet trajectory T and includes the first region R1. The plane that intersects the first mirror 415 may be a plane which is substantially parallel to the XZ plane.

The first mirror 415 may be provided along an optical path of the illuminating light, which is transmitted through the first window 414, in the interior of the first protruding portion 2c.

The first mirror 415 may be provided between the first window 414 and the first shielding member 416.

The first mirror 415 may be arranged to respectively face the first window 414 and the first region R1.

The first mirror 415 may reflect the illuminating light which is transmitted through the first window 414 toward the first region R1.

The first shielding member 416 of the first embodiment may be a member that shields the first window 414 from emissions from the plasma. That is, the first shielding member 416 may suppress adhesion of emissions from the plasma onto the first window 414 as the debris D.

The first shielding member 416 may be provided in a portion where the interior space of the first protruding portion 2c and the interior space of the target supply channel 2b communicate with each other. That is, the first shielding member 416 may be provided in the interior of the chamber 2.

The first shielding member 416 may be provided at a position that intersects the plane that intersects the droplet trajectory T and includes the first region R1. The plane that intersects the first shielding member 416 may be a plane which is substantially parallel to the XZ plane.

The first shielding member 416 may be provided along an optical path of the illuminating light which is reflected by the first mirror 415.

The first shielding member 416 may be formed to be of a plate shape that occludes the portion where the interior space of the first protruding portion 2c and the interior space of the target supply channel 2b communicate with each other.

A first opening 416a may be formed at a portion of the first shielding member 416 that intersects the optical path of the illuminating light which is reflected by the first mirror 415. The first opening 416a may enable the illuminating light which is reflected by the first mirror 415 to pass therethrough toward the first region R1.

The light receiving unit 430 of the first embodiment may be provided in the second protruding portion 2d.

The light receiving unit 430 of the first embodiment may include the light sensor 431, the light receiving optical system 432, the second window 434, the second mirror 435, and the second shielding member 436.

In the light receiving unit 430 of the first embodiment, the second shielding member 436, the second mirror 435, the second window 434, the light receiving optical system 432, and the light sensor 431 may be provided in this order on the optical path of the illuminating light in the direction in which the illuminating light propagates. That is, the order in which the constituent elements of the light receiving unit 430 of the first embodiment are arranged may be that in which the arrangement order of the second window 434 and the second mirror 435 of the light receiving unit 430 of the comparative example are reversed.

The second mirror 435 of the first embodiment may be configured to have a high reflectance with respect to the wavelength of the illuminating light. The surface roughness of a reflective surface of the second mirror 435 may be that having a maximum height Rz (JIS B 0601:2001) of 30 nm or greater and 60 nm or less, for example.

The second mirror 435 may be provided in the interior of the second protruding portion 2d. That is, the second mirror 435 may be provided in the interior of the chamber 2.

The second mirror 435 may be provided at a position that intersects the plane that intersects the droplet trajectory T and includes the first region R1. The plane that intersects the second mirror 435 may be a plane which is substantially parallel to the XZ plane.

The second mirror 435 may be arranged to face the first mirror 415 of the illuminating unit 410 with the first region R1 interposed therebetween.

The second mirror 435 may be provided along an optical path of the illuminating light, which is output to the first region R1, in the interior of the second protruding portion 2d.

The second mirror 435 may be provided between the second window 434 and the second shielding member 436.

The second mirror 435 may be arranged to respectively face the second window 434 and the first region R1.

The second mirror 435 may reflect the illuminating light which is output to the first region R1 toward the second window 434 provided in the wall 2a that forms the second protruding portion 2d.

The second window 434 of the first embodiment may be provided in the wall 2a that forms the second protruding portion 2d. The second window 434 may be provided in the surface of the wall 2a that forms the second protruding portion 2d on the side close to the plasma generating region 25.

The second window 434 may be provided closer to the plasma generating region 25 in a direction along the droplet trajectory T than the second mirror 435 is.

The second window 434 may be provided along the optical path of the illuminating light which is reflected by the second mirror 435.

The second window 434 may transmit the illuminating light which is reflected by the second mirror 435 toward the exterior of the second protruding portion 2d.

The light receiving optical system 432 of the first embodiment may be provided outside the wall 2a that forms the second protruding portion 2d. That is, the light receiving optical system 432 may be provided at the exterior of the chamber 2.

The light receiving optical system 432 may be provided apart from the wall 2a that forms the second protruding portion 2d.

The light receiving optical system 432 may be provided between the second window 434 which is provided in the wall 2a that forms the second protruding portion 2d and the light sensor 431.

The light receiving optical system 432 may transmit the illuminating light which is transmitted through the second window 434 and guide the transmitted illuminating light to the light sensor 431.

The light sensor 431 of the first embodiment may be provided outside the wall 2a that forms the second protruding portion 2d. That is, the light sensor 431 may be provided at the exterior of the chamber 2.

The light sensor 431 may be provided apart from the wall 2a that forms the second protruding portion 2d.

The light sensor 431 may be arranged to face the second window 434 provided in the wall 2a that forms the second protruding portion 2d, via the light receiving optical system 432.

The light sensor 431 may be provided on the optical path of the illuminating light which is transmitted through the light receiving optical system 432.

The second shielding member 436 of the first embodiment may be a member that shields the second window 434 from emissions from the plasma. That is, the second shielding member 436 may suppress adhesion of emissions from the plasma onto the second window 434 as the debris D.

The second shielding member 436 may be provided in a portion where the interior space of the second protruding portion 2d and the interior space of the target supply channel 2b communicate with each other. That is, the second shielding member 436 may be provided in the interior of the chamber 2.

The second shielding member 436 may be provided at a position that intersects the plane that intersects the droplet trajectory T and includes the first region R1. The plane that intersects the second shielding member 436 may be a plane which is substantially parallel to the XZ plane.

The second shielding member 436 may be provided along an optical path of the illuminating light which is output to the first region R1.

The second shielding member 436 may be formed to be of a plate shape that occludes the portion where the interior space of the second protruding portion 2d and the interior space of the target supply channel 2b communicate with each other.

A second opening 436a may be formed at a portion of the second shielding member 436 that intersects the optical path of the illuminating light which is output to the first region R1. The second opening 436a may enable the illuminating light which is output to the first region R1 to pass therethrough toward the second mirror 435.

According to the configuration of the first embodiment described above, the light source 411, the illuminating optical system 412, and the first window 414, as well as the light sensor 431, the light receiving optical system 432, and the second window 434 may be of the arrangement to be described below.

That is, the light source 411, the illuminating optical system 412, and the first window 414 may be provided closer to the plasma generating region 25 in a direction along the droplet trajectory T than the axis of the optical path of the illuminating light is, the axis extending between the first mirror 415 and the second mirror 435 and passing through the first region R1.

Similarly, the light sensor 431, the light receiving optical system 432, and the second window 434 may be provided closer to the plasma generating region 25 in a direction along the droplet trajectory T than the axis of the optical path of the illuminating light is, the axis extending between the first mirror 415 and the second mirror 435 and passing through the first region R1.

Note that the expression "provided closer to the plasma generating region 25" may mean that a constituent element is provided in a region in which the plasma generating region 25 is present, in the case that the EUV light generating apparatus 1 is partitioned by a plane that includes the optical path of the illuminating light that passes through the first region R1 and perpendicularly intersects the droplet trajectory T.

Figure 5:
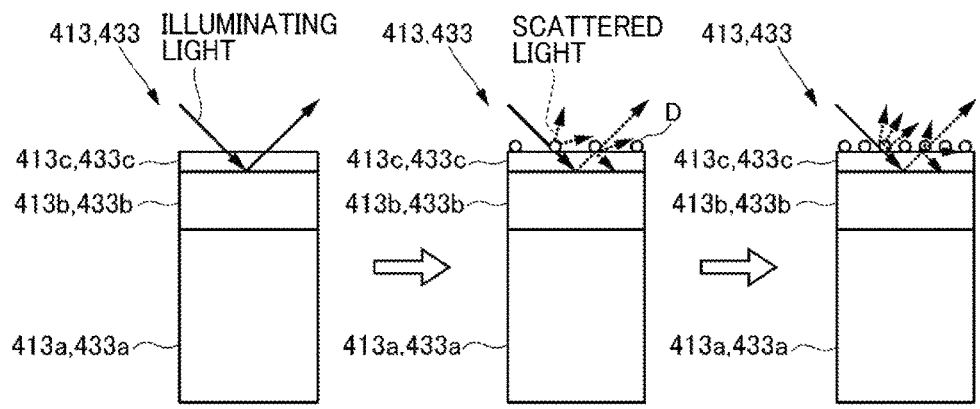
FIG. 5 is a diagram for explaining the detailed configurations of a first and a second mirror of the comparative example.

FIG. 5 is a diagram for explaining the detailed configurations of the first and second mirrors 413 and 433 of the comparative example 1.

FIG. 5 illustrates the state of the illuminating light which is reflected by the first and second mirrors 413 and 433 in the case that emissions from plasma are caused to enter the first and second mirrors 413 and 433 of the comparative example.

The first and second mirrors 413 and 433 of the comparative example may be mirrors having protective films on the side of the reflective surfaces thereof.

That is, the first mirror 413 may be configured by forming a metal film 413b on a substrate 413a, and coating a surface of the metal film 413b with a protective film 413c that transmits the illuminating light. The reflective surface of the first mirror 413 may be constituted by the surface of the protective film 413c and the surface of the metal film 413b.

Similarly, the second mirror 433 may be configured by forming a metal film 433b on a substrate 433a, and coating a surface of the metal film 433b with a protective film 433c that transmits the illuminating light. The reflective surface of the second mirror 433 may be constituted by the surface of the protective film 433c and the surface of the metal film 433b.

If the emissions from the plasma enter the first and second mirrors 413 and 433, the emissions may adhere onto the protective films 413c and 433c, and accumulate on the protective films 413c and 433c as the debris D.

Thereby, a portion of the illuminating light that enters the first and second mirrors 413 and 433 may be reflected by the debris D which is accumulated on the protective films 413c and 433c, and another portion may be transmitted through the protective films 413c and 433c to be reflected by the metal films 413b and 433b.

As a result, the first and second mirrors 413 and 433 of the comparative example will cause scattering of the illuminating light, and a decrease in reflectance may be generated.

Figure 6:
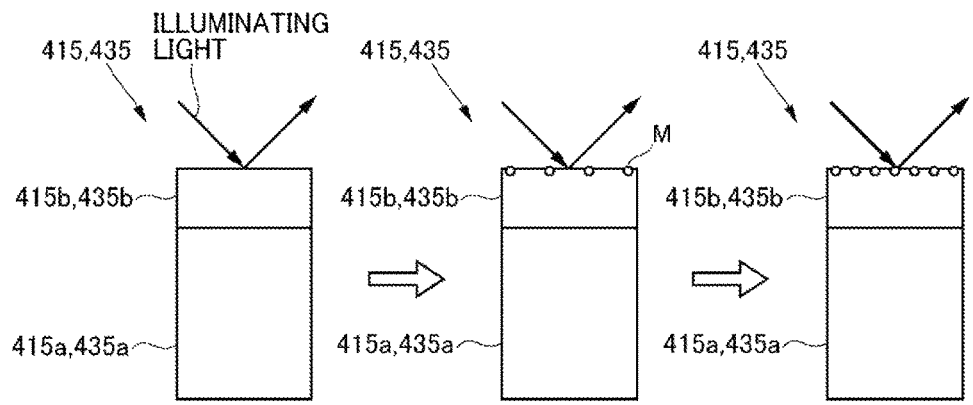
FIG. 6 is a diagram for explaining the detailed configurations of a first and a second mirror of the first embodiment.

FIG. 6 is a diagram for explaining the detailed configurations of the first and second mirrors 415 and 435 of the first embodiment.

FIG. 6 illustrates the state of the illuminating light which is reflected by the first and second mirrors 415 and 435 in the case that emissions from plasma are caused to enter the first and second mirrors 415 and 435 of the first embodiment.

The first and second mirrors 415 and 435 of the first embodiment may be mirrors having reflective surfaces constituted by metal layers in a bulk state, without protective films thereon.

That is, the first mirror 415 may be configured by forming a metal layer 415b on a substrate 415a, and a protective film may not be formed. The reflective surface of the first mirror 415 may be constituted by the surface of the metal layer 415b in the bulk state.

Similarly, the second mirror 435 may be configured by forming a metal layer 435b on a substrate 435a, and a protective film may not be formed. The reflective surface of the second mirror 435 may be constituted by the surface of the metal layer 435b in the bulk state.

In the case that the material of the target 27 is tin, the metal films 415b and 435b may be formed by at least one metal material from a group consisting of silver, copper, and aluminum, for example.

If the emissions from the plasma enter the first and second mirrors 415 and 435, the emissions may respectively form an alloy M with the metal films 415b and 435b due to the kinetic energy thereof, as illustrated in FIG. 6.

Thereby, a majority of the illuminating light that enters the first and second mirrors 415 and 435 may be reflected by the alloy M which is formed on the surfaces of the metal layers 415b and 435b.

As a result, the first and second mirrors 415 and 435 of the first embodiment do not cause scattering of the illuminating light, and a decrease in the reflectances thereof may be suppressed to decreases down to approximately the reflectance of the alloy M which is formed on the surfaces of the metal layers 415b and 435b.

In addition, the surface roughness of the reflective surfaces of the first and second mirrors 415 and 435 of the first embodiment is that having a maximum height Rz (JIS B 0601:2001) of 30 nm or greater and 60 nm or less. Meanwhile, the size of the atoms of the target 27 may be less than 1 nm.

For this reason, the emissions from the plasma have less influence on the decrease in the reflectance, even if the emissions from the plasma accumulate on the reflective surfaces of the first and second mirrors 415 and 435.

The other structures of the illuminating unit 410 and the light receiving unit 430 of the first embodiment may be the same as those of the illuminating unit 410 and the light receiving unit 430 of the comparative example.

The other structures of the EUV light generating apparatus 1 of the first embodiment may be the same as those of the EUV light generating apparatus 1 of the comparative example.

[4.2 Operation]

The operation of the EUV light generating apparatus 1 of the first embodiment will be described.

Descriptions of the operations of the EUV light generating apparatus 1 of the first embodiment which are the same as those of the EUV light generating apparatus 1 of the comparative example will be omitted.

The light source 411 may output the illuminating light so as to illuminate the droplet 271 that passes through the first region R1, in the same manner as the light source 411 of the comparative example.

The illuminating light which is output from the light source 411 may be transmitted through the illuminating optical system 412 and the first window 414, and then may be reflected by the first mirror 415. The illuminating light which is reflected by the first mirror 415 may propagate toward the first region R1 via the first opening 416a of the first shielding member 416.

The illuminating light which passes through the first region R1 may propagate toward the second mirror 435 via the second opening 436a of the second shielding member 436, and may be reflected by the second mirror 435. The illuminating light which is reflected by the second mirror 435 may be transmitted through the second window 434 and the light receiving optical system 432, and then may be detected by the light sensor 431.

The light sensor 431 may detect the illuminating light, which is output so as to illuminate the droplet 271 that passes through the first region R1, with a photodiode array included in the light sensor 431, to detect the droplet 271 that passes through the first region R1.

It may become difficult for the emissions from the plasma to enter the interiors of the first and second protruding portions 2c and 2d, by entry being prevented by the first and second shielding members 416 and 436. That is, the amount of the emissions from the plasma that may enter the first and second windows 414 and 434 may decrease.

Even assuming a case in which the emissions from the plasma enter the interiors of the first and second protruding portions 2c and 2d, although the emissions from the plasma may enter the first and second mirrors 415 and 435, it will be difficult for the emissions from the plasma to enter the first and second windows 414 and 434. This is because the first and second mirrors 415 and 435 are provided in front of the first and second windows 414 and 434 along the paths along which the emissions from the plasma may enter the interiors of the first and second protruding portions 2c and 2d.

Particularly, the first and second windows 414 and 434 may be provided closer to the plasma generating region 25 than the axis of the optical path of the illuminating light is, the axis extending between the first mirror 415 and the second mirror 435 and passing through the first region R1. In this case, it may become more difficult for the emissions from the plaza to enter the first and second windows 414 and 434.

If it becomes difficult for the emissions from the plasma to enter the first and second windows 414 and 434, the amount of the emissions from plasma that may adhere to the first and second windows 414 and 434 as the debris D may decrease.

Even if the emissions from the plasma enter the first and second mirrors 415 and 435, the alloy M may be formed by the emissions from the plasma and the metal layers 415b and 435b at the first and second mirrors 415 and 435. Therefore, a decrease in the reflectance of the first and second mirrors 415 and 435 may be suppressed.

The other operations of the illuminating unit 410 and the light receiving unit 430 of the first embodiment may be the same as those of the illuminating unit 410 and the light receiving unit 430 of the comparative example.

The other operations of the EUV light generating apparatus 1 of the first embodiment may be the same as those of the EUV light generating apparatus 1 of the comparative example.

[4.3 Functions and Effects]

The EUV light generating apparatus 1 of the first embodiment is capable of suppressing adhesion of the debris D on the first and second windows 414 and 434. Therefore, the EUV light generating apparatus 1 of the first embodiment is capable of suppressing a decrease in the transmissivity of the first and second windows 414 and 434.

In addition, the reflective surfaces of the first and second mirrors 415 and 435 are constituted by the metal layers 415b and 435b in the EUV light generating apparatus 1 of the first embodiment. Therefore, EUV light generating apparatus 1 of the first embodiment is capable of suppressing a decrease in the reflectance of the first and second mirrors 415 and 435.

Thereby, the EUV light generating apparatus 1 of the first embodiment is capable of suppressing a decrease in the contrast of the illuminating light which is detected by the light sensor 431, and is capable of appropriately judging whether the droplet 271 has passed through the first region R1.

As a result, the EUV light generating apparatus 1 of the first embodiment is capable of improving the detection accuracy of the droplet detector 41.

[4.4 First Modification]

In the droplet detector 41 of a first modification of the first embodiment, the first and second shielding members 416 and 436 may be formed to be of hollow cylindrical shapes, instead of plate shapes.

The first shielding member 416 which is formed to be of a cylindrical shape may be formed to extend toward the first region R1 from a position on the wall 2a in the vicinity of the periphery of the portion where the interior space of the first protruding portion 2c and the interior space of the target supply channel 2b communicate with each other. The first opening 416a, through which the illuminating light passes, may be formed in an end portion of the first shielding member 416 toward the side of the first region R1.

The second shielding member 436 which is formed to be of a cylindrical shape may be formed to extend toward the first region R1 from a position on the wall 2a in the vicinity of the periphery of the portion where the interior space of the second protruding portion 2d and the interior space of the target supply channel 2b communicate with each other. The second opening 436a, through which the illuminating light passes, may be formed in an end portion of the second shielding member 436 toward the side of the first region R1.

Each of the first and second shielding members 416 and 436 which are formed to be of cylindrical shapes may be formed to cover the periphery of the optical path of the illuminating light that passes through the first region R1.

[4.5 Second Modification]

In the droplet detector 41 of a second modification of the first embodiment, the light receiving element which is included in the light sensor 431 may be an image sensor such as a CCD (Charge-Coupled Device), instead of the photodiode array or the like of the light sensor 431 of the comparative example.

In this case, the droplet detector 41 may be a detector that captures an image of the droplet 271 which has reached a predetermined second region R2, which is at a predetermined position in the interior of the chamber 2.

As illustrated in FIG. 4, the second region R2 is a region that includes the plasma generating region 25, and may be positioned along the droplet trajectory T in the same manner as the first region R1.

The illuminating unit 410 and the light receiving unit 430 may be arranged to face each other with the second region R2 along the droplet trajectory T interposed therebetween.

The light source 411 which is included in the illuminating unit 410 may output the illuminating light so as to illuminate the droplet 271 which has reached the second region R2.

The light sensor 431 which is included in the light receiving unit 430 may detect the illuminating light which is output so as to illuminate the droplet 271 which has reached the second region R2 with the image sensor which is included in the light sensor 431, to capture an image of the droplet 271.

[4.6 Third Modification]

In the droplet detector 41 of a third modification of the first embodiment, the material of the metal layers 415b and 435b that constitute the reflective surfaces of the first and second mirrors 415 and 435 may include the same metal material as that which forms the target 27. For example, in the case that the material of the target 27 is tin, the material of the metal layers 415b and 435b that constitute the reflective surfaces of the first and second mirrors 415 and 435 may be tin, or may be a tin compound having a reflectance equivalent to that of tin with respect to the wavelength of the illuminating light.

In this case, the reflectance of the first and second mirrors 415 and 435 may become less likely to change. Therefore, a decrease in the reflectance will be further suppressed compared to a case in which the material of the metal layers 415b and 435b is different from the metal material that forms the target 27.

[4.7 Fourth Modification]

The light source 411, the illuminating optical system 412, and the first window 414 of a fourth modification of the first embodiment may be provided closer to the target supply unit 26 in a direction along the droplet trajectory T than the axis of the optical path of the illuminating light is, the axis extending between the first mirror 415 and the second mirror 435 and passing through the first region R1.

Similarly, the light sensor 431, the light receiving optical system 432, and the second window 434 of the fourth modification of the first embodiment may be provided closer to the target supply unit 26 in a direction along the droplet trajectory T than the axis of the optical path of the illuminating light is, the axis extending between the first mirror 415 and the second mirror 435 and passes through the first region R1.

In this case as well, travel of the emissions from the plasma is prevented by the first and second shielding members 416 and 436, and it may become difficult for the emissions from the plasma to enter the first and second protruding portions 2c and 2d. In addition, the first and second mirrors 415 and 435 are provided in front of the first and second windows 414 and 434 along the paths along which the emissions from the plasma may enter the interiors of the first and second protruding portions 2c and 2d. For this reason, it will become difficult for the emissions from the plasma to enter the first and second windows 414 and 434, and adhesion of the emissions from the plasma onto the first and second windows 414 and 434 as the debris D may be suppressed. Accordingly, a decrease in the transmissivity of the first and second windows 414 and 434 may be suppressed.

Note that the expression "provided closer to the target supply unit 26" may mean that a constituent element is provided in a region in which the target supply unit 26 is present, in the case that the EUV light generating apparatus 1 is partitioned by a plane that includes the optical path of the illuminating light that passes through the first region R1 and perpendicularly intersects the droplet trajectory T.

5. Second Embodiment

An EUV light generating apparatus 1 according to a second embodiment will be described with reference to FIG. 7.

The EUV light generating apparatus 1 of the second embodiment may be of a configuration which is additionally equipped with a gas supply apparatus 72 compared to the EUV light generating apparatus 1 of the first embodiment.

Descriptions of the structures of the EUV light generating apparatus 1 of the second embodiment which are the same as those of the EUV light generating apparatus 1 of the first embodiment will be omitted.

[5.1 Configuration]

Figure 7:
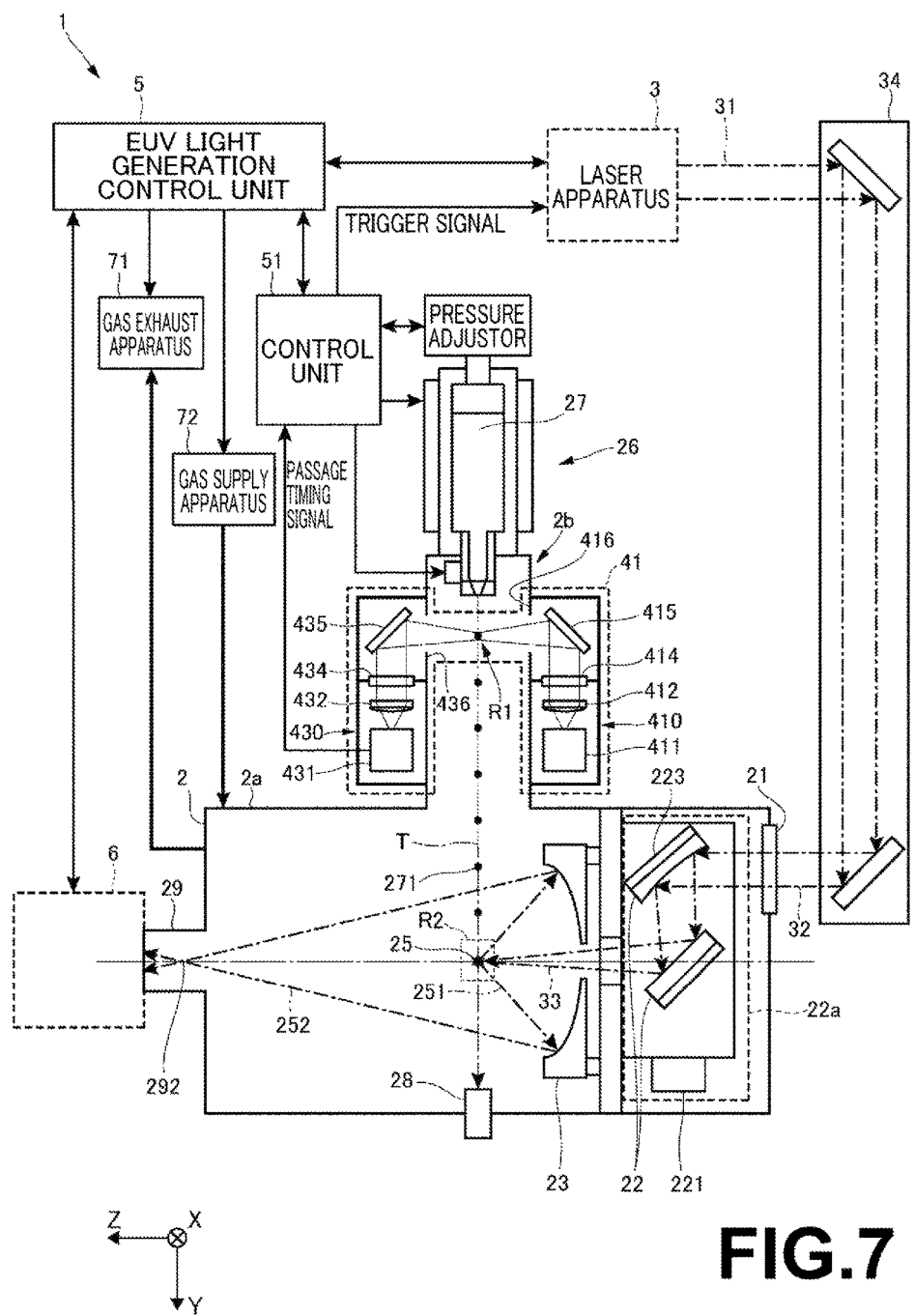
FIG. 7 is a diagram for explaining the configuration of an EUV light generating apparatus according to a second embodiment.

FIG. 7 is a diagram for explaining the configuration of the EUV light generating apparatus 1 of the second embodiment.

The gas supply apparatus 72 of the second embodiment may supply a gas to the interior of the chamber 2.

The gas which is supplied from the gas supply apparatus 72 may be a gas which has reducing properties with respect to the metal material that forms the target 27. The gas which is supplied from the gas supply apparatus 72 may be a gas that reacts with the target 27 and generates gaseous reaction products at ambient temperature. In the case that the target 27 is tin, the gas which is supplied from the gas supply apparatus 72 may be hydrogen gas, a hydrogen radical gas, or a gas that contains these gases.

The operation of the gas supply apparatus 72 may be controlled by the EUV light generation control unit 5.

The gas supply apparatus 72 may supply the gas to the chamber 2 at least during generation of the EUV light 252, according to control from the EUV light generation control unit 5.

The other structures of the EUV light generating apparatus 1 of the second embodiment may be the same as those of the EUV light generating apparatus 1 of the first embodiment.

[5.2 Operation, Functions, and Effects]

In the EUV light generating apparatus 1 of the second embodiment, the gas having reducing properties with respect to the metal material that forms the target 27 may be supplied to the interior of the chamber 2. Therefore, oxidation of the droplets 271 and the emissions from the plasma may be suppressed.

In addition, in the EUV light generating apparatus 1 of the second embodiment, the debris D may react with the gas and become a gaseous reaction product at ambient temperature, even if the debris D becomes adhered to the first and second mirrors 415 and 435. Therefore, the debris D may be removed from the first and second mirrors 415 and 435.

Thereby, the EUV light generating apparatus 1 of the second embodiment is capable of suppressing a decrease in the reflectance of the first and second mirrors 415 and 435.

As a result, the EUV light generating apparatus 1 of the second embodiment is capable of suppressing a decrease in the contrast of the illuminating light which is detected by the light sensor 431. Therefore, the EUV light generating apparatus 1 of the second embodiment is capable of improving the detection accuracy of the droplet detector 41.

6. Third Embodiment

An EUV light generating apparatus 1 according to a third embodiment will be described with reference to FIG. 8.

In the EUV light generating apparatus 1 of the third embodiment, the flow of gas which is supplied from the gas supply apparatus 72 may differ from that in the EUV light generating apparatus 1 of the second embodiment.

Descriptions of the structures of the EUV light generating apparatus 1 of the third embodiment which are the same as those of the EUV light generating apparatus 1 of the second embodiment will be omitted.

[6.1 Configuration]

Figure 8:
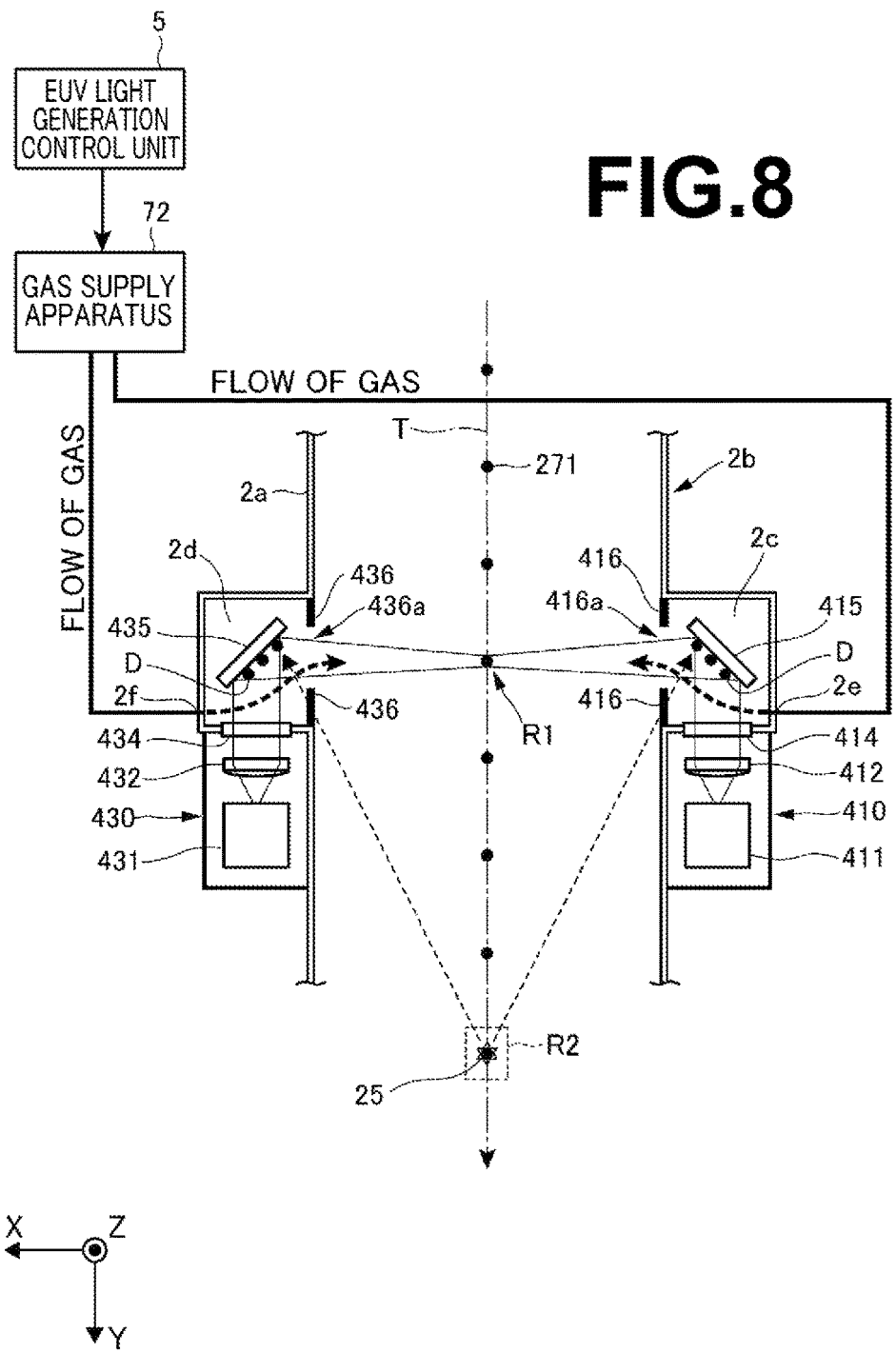
FIG. 8 is a diagram for explaining the configuration of an EUV light generating apparatus according to a third embodiment.

FIG. 8 is a diagram for explaining the configuration of the EUV light generating apparatus 1 of the third embodiment.

The gas supply apparatus 72 of the third embodiment may supply gas to the interior of the chamber 2 from at least one of a first supply port 2e provided in the first protruding portion 2c and a second supply port 2f provided in the second protruding portion 2d.

The gas which is supplied from the gas supply apparatus 72 may be the same gas as that of the second embodiment.

The first supply port 2e may be an entry for supplying the gas from the gas supply apparatus 72 to the interior of the first protruding portion 2c.

The first supply port 2e may be provided in the wall 2a that forms the interior space of the first protruding portion 2c. That is, the first supply port 2e may be provided in the wall 2a that forms the interior space of the chamber 2 between the first shielding member 416 and the first window 414.

The first supply port 2e may be provided such that the gas which is supplied from the gas supply apparatus 72 flows along a surface of the first window 414 on a side facing the first shielding member 416 and is ejected to the exterior of the first protruding portion 2c from the first opening 416a of the first shielding member 416. The first supply port 2e may be provided such that the gas which is supplied from the gas supply apparatus 72 flows substantially parallel to the surface of the first window 414 on the side facing the first shielding member 416. The first supply port 2e may be provided such that the gas which is supplied from the gas supply apparatus 72 flows between the surface of the first window 414 on the side facing the first shielding member 416 and the reflective surface of the first mirror 415.

The second supply port 2f may be an entry for supplying the gas from the gas supply apparatus 72 to the interior of the second protruding portion 2d.

The second supply port 2f may be provided in the wall 2a that forms the interior space of the second protruding portion 2d. That is, the second supply port 2f may be provided in the wall 2a that forms the interior space of the chamber 2 between the second shielding member 436 and the second window 434.

The second supply port 2f may be provided such that the gas which is supplied from the gas supply apparatus 72 flows along a surface of the second window 434 on a side facing the second shielding member 436 and is ejected to the exterior of the second protruding portion 2d from the second opening 436a of the second shielding member 436. The second supply port 2f may be provided such that the gas which is supplied from the gas supply apparatus 72 flows substantially parallel to the surface of the second window 434 on the side facing the second shielding member 436. The second supply port 2f may be provided such that the gas which is supplied from the gas supply apparatus 72 flows between the surface of the second window 434 on the side facing the second shielding member 436 and the reflective surface of the second mirror 435.

The other structures of the EUV light generating apparatus 1 of the third embodiment may be the same as those of the EUV light generating apparatus 1 of the second embodiment.

[6.2 Operation, Functions, and Effects]

In the EUV light generating apparatus 1 of the third embodiment, the gas having reducing properties with respect to the metal material that forms the target 27 may flow along the surfaces of the first and second windows 414 and 434, and then may be ejected through the first and second openings 416a and 436a.

For this reason, it may become difficult for the emissions from the plasma to enter the first and second protruding portions 2c and 2d in the EUV light generating apparatus 1 of the third embodiment.

Even assuming that the emissions from the plasma enter the first and second protruding portions 2c and 2d, in the EUV light generating apparatus 1 of the third embodiment, the gas will mix up the emissions from the plasma, and may exhaust the emissions from the plasma to the exterior of the first and second protruding portions 2c and 2d. That is, the EUV light generating apparatus 1 of the third embodiment is capable of reducing the amount of the emissions from the plasma that may enter the first and second windows 414 and 434.

Even assuming that the emissions from the plasma adhere to the first and second windows 414 and 434 as the debris D, the debris D may react with the gas and may be removed from the first and second windows 414 and 434 in the EUV light generating apparatus 1 of the third embodiment.

Thereby, the EUV light generating apparatus 1 of the third embodiment is capable of suppressing a decrease in the transmissivity of the first and second windows 414 and 434.

In addition, in the EUV light generating apparatus 1 of the third embodiment, the gas which has reducing properties with respect to the metal material that forms the target 27 may flow between the surfaces of the first and second windows 414 and 434 and the reflective surfaces of the first and second mirrors 415 and 435.

For this reason, even assuming that the emissions from the plasma adhere onto the first and second mirrors 415 and 435 as the debris D, the debris D may react with the gas and may be removed from the first and second mirrors 415 and 435 in the EUV light generating apparatus 1 of the third embodiment.

Thereby, the EUV light generating apparatus 1 of the third embodiment is capable of suppressing a decrease in the reflectance of the first and second mirrors 415 and 435.

Accordingly, the EUV light generating apparatus 1 of the third embodiment is capable of suppressing a decrease in the contrast of the illuminating light which is detected by the light sensor 431. Therefore, the EUV light generating apparatus 1 of the third embodiment is capable of improving the detection accuracy of the droplet detector 41.

7. Fourth Embodiment

An EUV light generating apparatus 1 according to a fourth embodiment will be described with reference to FIG. 9.

The EUV light generating apparatus 1 of the fourth embodiment may be of a configuration which is additionally equipped with a coolant supply apparatus 81 as well as temperature sensors 821 and 822, compared to the EUV light generating apparatus 1 of the first embodiment.

Descriptions of the structures of the EUV light generating apparatus 1 of the fourth embodiment which are the same as those of the EUV light generating apparatus 1 of the first embodiment will be omitted.

[7.1 Configuration]

Figure 9:
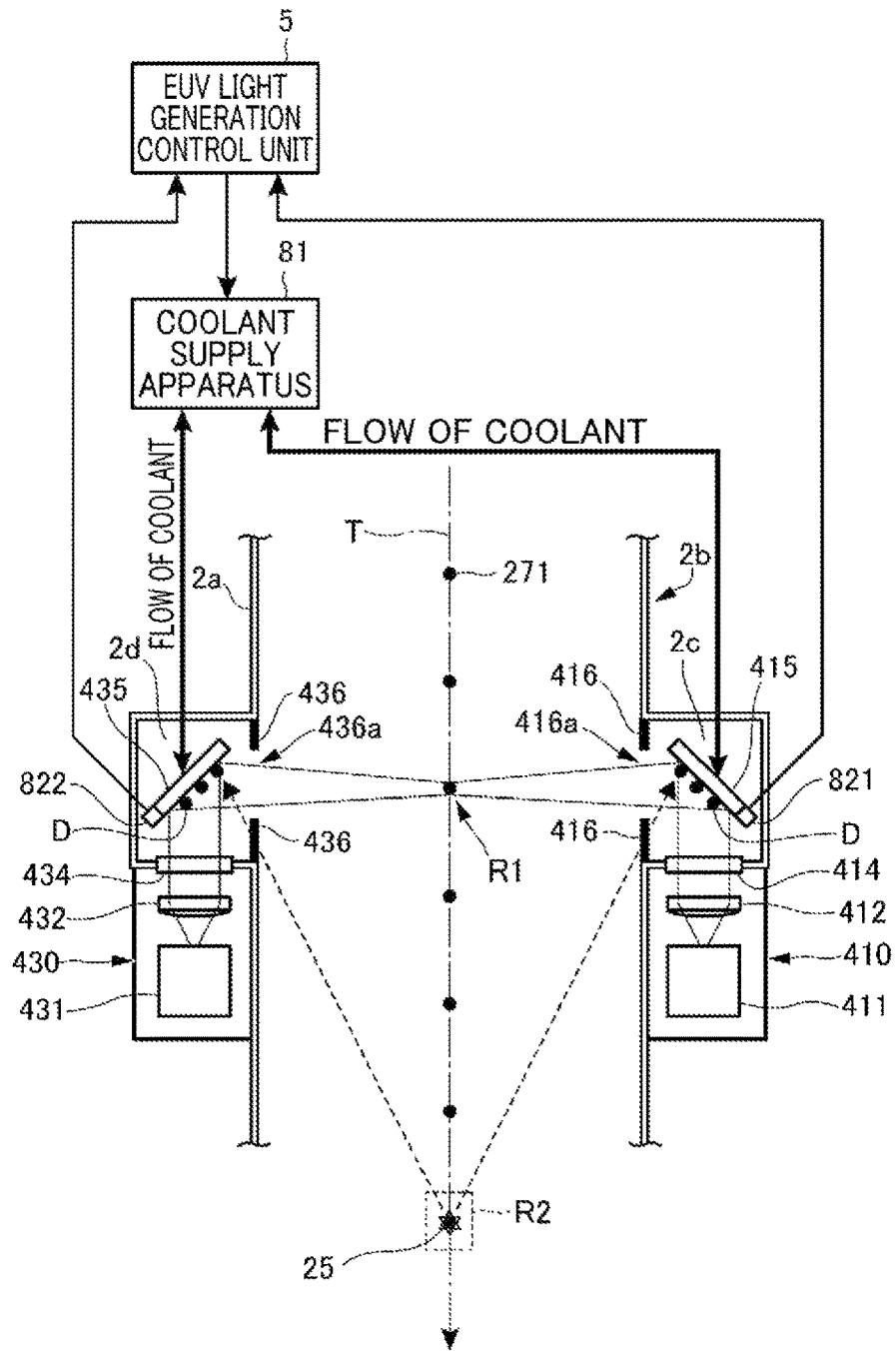
FIG. 9 is a diagram for explaining the configuration of an EUV light generating apparatus according to a fourth embodiment.

FIG. 9 is a diagram for explaining the configuration of the EUV light generating apparatus 1 of the fourth embodiment.

The coolant supply apparatus 81 of the fourth embodiment may be an apparatus that supplies a coolant that cools the first and second mirrors 415 and 435 to the interiors of the first and second mirrors 415 and 435.

The coolant which is supplied from the coolant supply apparatus 81 may be cooling water, for example.

The coolant supply apparatus 81 may be a chiller, for example.

The coolant supply apparatus 81 may be connected to coolant channels, which are not illustrated, provided in the interior of the first and second mirrors 415 and 435 via pipes, which are not illustrated. The coolant supply apparatus 81 may circulate the coolant within the coolant channels which are provided in each of the first and second mirrors 415 and 435.

The operation of the coolant supply apparatus 81 may be controlled by the EUV light generation control unit 5.

The temperature sensors 821 and 822 of the fourth embodiment may be provided on the first and second mirrors 415 and 435, and may detect the temperatures of the first and second mirror 415 and 435. The temperature sensors 821 and 822 may output detection signals corresponding to the detected temperatures of the first and second mirrors 415 and 435 to the EUV light generation control unit 5.

The EUV light generation control unit 5 of the fourth embodiment may control the operation of the coolant supply apparatus 81 based on the detection signals from the temperature sensors 821 and 822. The EUV light generation control unit 5 may control the operation of the coolant supply apparatus 81 to maintain the temperatures of the first and second mirrors 415 and 435 to be substantially constant at a target temperature. The target temperature for the first and second mirrors 415 and 435 of the fourth embodiment may be 30° C., for example.

The other structures of the EUV light generating apparatus 1 of the fourth embodiment may be the same as those of the EUV light generating apparatus 1 of the first embodiment.

[7.2 Operations, Functions, and Effects]

Because the emissions from the plasma may enter the first and second mirrors 415 and 435, the first and second mirrors 415 and 435 are likely to become overheated due to collisions with the emissions from the plasma. If the first and second mirrors 415 and 435 become overheated, the position or the orientation of the first and second mirrors 415 and 435 may become shifted due to thermal deformation, and the illumination light may not be reflected appropriately.

The EUV light generating apparatus 1 of the fourth embodiment is capable of cooling the first and second mirrors 415 and 435 by heat exchange with the coolant which is supplied from the coolant supply apparatus 81 and maintaining the temperatures of the first and second mirrors 415 and 435 constant at the target temperature.

For this reason, the EUV light generating apparatus 1 of the fourth embodiment is capable of suppressing overheating the first and second mirrors 415 and 435. Therefore, shifting of the position or the orientation of the first and second mirrors 415 and 435 may be suppressed.

Thereby, the first and second mirrors 415 and 435 of the EUV light generating apparatus 1 of the fourth embodiment are capable of appropriately reflecting the illuminating light. Therefore, the EUV light generating apparatus 1 of the fourth embodiment is capable of suppressing shifting of the optical path of the illuminating light from a desired optical path.

As a result, the EUV light generating apparatus 1 of the fourth embodiment is capable of suppressing a decrease in the contrast of the illuminating light which is detected by the light sensor 431. Therefore, the EUV light generating apparatus 1 of the fourth embodiment is capable of improving the detection accuracy of the droplet detector 41.

8. Fifth Embodiment

An EUV light generating apparatus 1 according to a fifth embodiment will be described with reference to FIG. 10.

The EUV light generating apparatus 1 of the fifth embodiment may be of a configuration which is additionally equipped with heaters 831 and 832, compared to the EUV light generating apparatus 1 of the fourth embodiment.

Descriptions of the structures of the EUV light generating apparatus 1 of the fifth embodiment which are the same as those of the EUV light generating apparatus 1 of the fourth embodiment will be omitted.

[8.1 Configuration]

Figure 10:
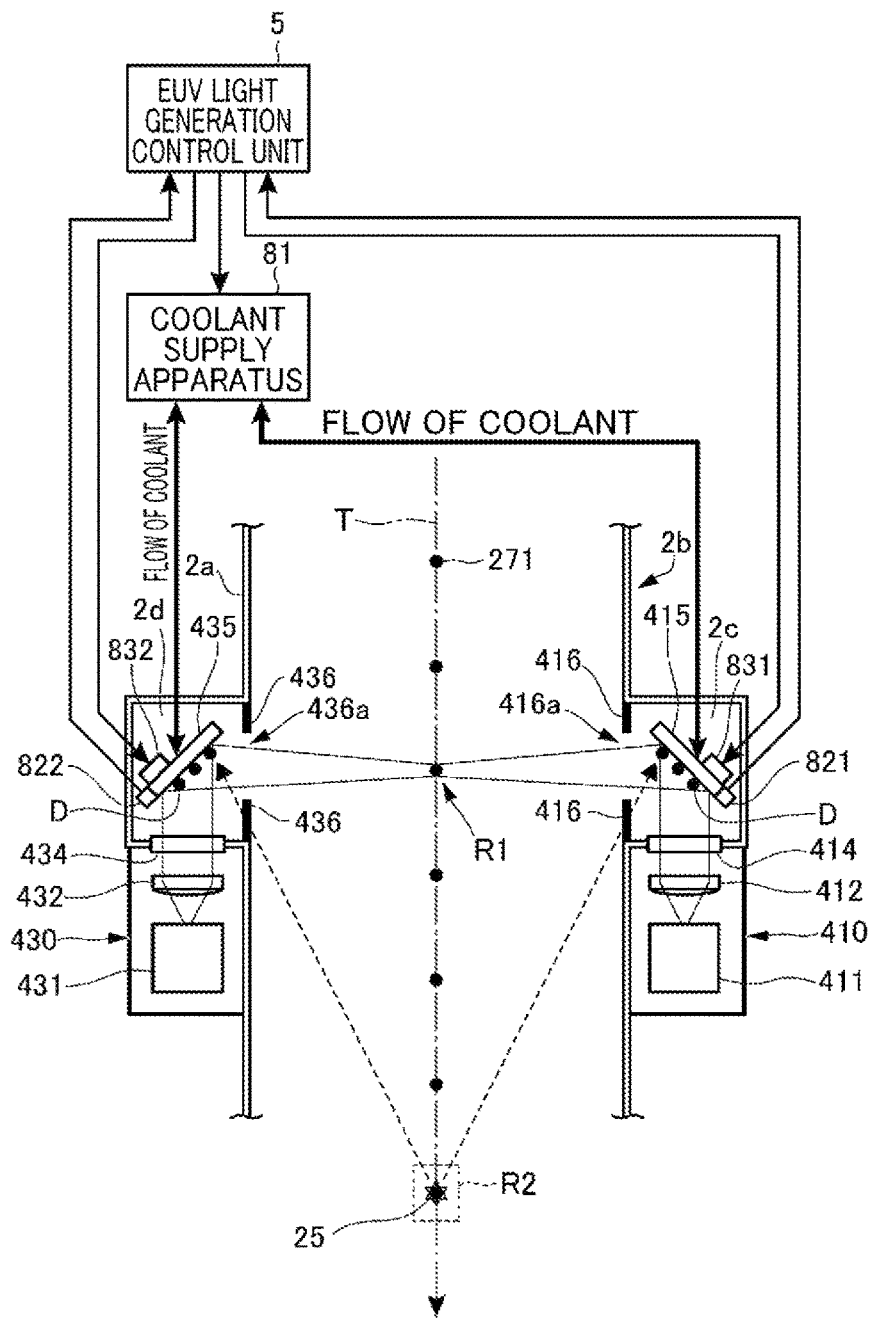
FIG. 10 is a diagram for explaining the configuration of an EUV light generating apparatus according to a fifth embodiment.

FIG. 10 is a diagram for explaining the configuration of the EUV light generating apparatus of the fifth embodiment.

The heaters 831 and 832 of the fifth embodiment may be provided on the first and second mirrors 415 and 435, and may heat the first and second mirrors 415 and 435. The heaters 831 and 832 may heat the first and second mirrors 415 and 435, which are cooled by heat exchange with the coolant which is supplied from the coolant supply apparatus 81.

The operation of the heaters 831 and 832 may be controlled by the EUV light generation control unit 5.

The EUV light generation control unit 5 of the fifth embodiment may control the operation of the heaters 831 and 832 based on the detection signals from the temperature sensors 821 and 822. The EUV light generation control unit 5 may control the heaters 831 and 832 to maintain the temperatures of the first and second mirrors 415 and 435 to be substantially constant at a target temperature. The target temperature for the first and second mirrors 415 and 435 of the fifth embodiment may be 200° C., for example.

Note that the coolant supply apparatus 81, the coolant channels which are provided in the first and second mirrors 415 and 435, the pipe that connects the coolant channels with the coolant supply apparatus 81, and the coolant which is supplied from the coolant supply apparatus 81 will also be collectively referred to as a cooling mechanism. The cooling mechanism may include the control functions of the EUV light generation control unit 5 that controls cooling of the first and second mirrors 415 and 435.

Further, the cooling mechanism and the heaters 831 and 832 will also be collectively referred to as a temperature adjusting mechanism. The temperature adjusting mechanism may also include the temperature sensors 831 and 832. Further, the temperature adjusting mechanism may include the control functions of the EUV light generation control unit 5 that controls heating of the first and second mirrors 415 and 435.

The other structures of the EUV light generating apparatus 1 of the fifth embodiment may be the same as those of the EUV light generating apparatus 1 of the fourth embodiment.

[8.2 Operation, Functions, and Effects]

As described above, the first and second mirrors 415 and 435 may be cooled by heat exchange with the coolant which is supplied from the coolant supply apparatus 81. At this time, there may be a possibility that the first and second mirrors 415 and 435 will be excessively cooled.

If the emissions from the plasma enter the excessively cooled first and second mirrors 415 and 435, heat of the emissions from the plasma may be rapidly lost to the first and second mirrors 415 and 435. For this reason, the emissions from the plasma may solidify before forming the alloy M with the metal layers 415b and 435b which are included in the first and second mirrors 415 and 435, and become adhered as the debris D. Over time, the debris D may accumulate on the first and second mirrors 415 and 435, and the surface roughness of the first and second mirrors 415 and 435 may become greater. Thereby, the reflectance of the first and second mirrors 415 and 435 may decrease.

The EUV light generating apparatus 1 of the fifth embodiment is capable of heating the first and second mirrors 415 and 435 with the temperature adjusting mechanism to maintain the temperatures thereof to be constant at the target temperature, even if there is a possibility that the first and second mirrors 415 and 435 will be excessively cooled.

Thereby, the EUV light generating apparatus 1 of the fifth embodiment is capable of suppressing a decrease in the reflectance of the first and second mirrors 415 and 435.

As a result, the EUV light generating apparatus 1 of the fifth embodiment is capable of suppressing a decrease in the contrast of the illuminating light which is detected by the light sensor 431. Therefore, the EUV light generating apparatus 1 of the fifth embodiment is capable of improving the detection accuracy of the droplet detector 41.

[8.3 First Modification]

Temperature changes may occur at the first and second mirrors 415 and 435 when the emissions from plasma enter thereinto and during adjustment by the temperature adjusting mechanism.

The first and second mirrors 415 and 435 of a first modification of the fifth embodiment may be formed such that the substrates 415a and 435a are formed by a metal material having a higher coefficient of thermal conductivity than optical glass. In the case that the material of the target 27 is tin, the substrates 415a and 435a may be formed of at least one metal material selected from a group consisting of copper, tungsten, and molybdenum.

In this case, the relaxation time of the first and second mirrors 415 and 435 with respect to temperature changes that occur when the emissions from plasma enter thereinto and during temperature adjustment by the temperature adjusting mechanism may become shorter than that for a case in which the substrates 415a and 435a are formed by optical glass.

Accordingly, the amount of thermal deformation that accompanies temperature changes that occur when the emissions from plasma enter thereinto and during temperature adjustment by the temperature adjusting mechanism may become small, and tracking properties with respect to temperature adjustments by the temperature adjusting mechanism may improve in the first and second mirrors 415 and 435.

[8.4 Second Modification]

In the first and second mirrors 415 and 435 of a second modification of the fifth embodiment, the substrates 415a and 435a may be formed by a ceramic material having a higher coefficient of thermal conductivity than optical glass. In the case that the material of the target 27 is tin, the substrates 415a and 435a may be formed by a ceramic material such as alumina.

In this case, the amount of thermal deformation of the first and second mirrors 415 and 435 with respect to temperature changes that occur when the emissions from plasma enter thereinto and during temperature adjustment by the temperature adjusting mechanism may become small, and the tracking properties with respect to temperature adjustment by the temperature adjusting mechanism may improve.

Further, in this case, it is also possible to suppress corrosion of the substrates 415a and 435a caused by reacting with the target 27 at the first mirror and the second mirror 415 and 435.

9. Sixth Embodiment

An EUV light generating apparatus 1 according to a sixth embodiment will be described with reference to FIG. 11.

The EUV light generating apparatus 1 of the sixth embodiment may be of a configuration which is additionally equipped with first and second tilt stages 417 and 437 compared to the EUV light generating apparatus 1 of the first embodiment.

Descriptions of the structures of the EUV light generating apparatus 1 of the sixth embodiment which are the same as those of the EUV light generating apparatus 1 of the first embodiment will be omitted.

[9.1 Configuration]

Figure 11:
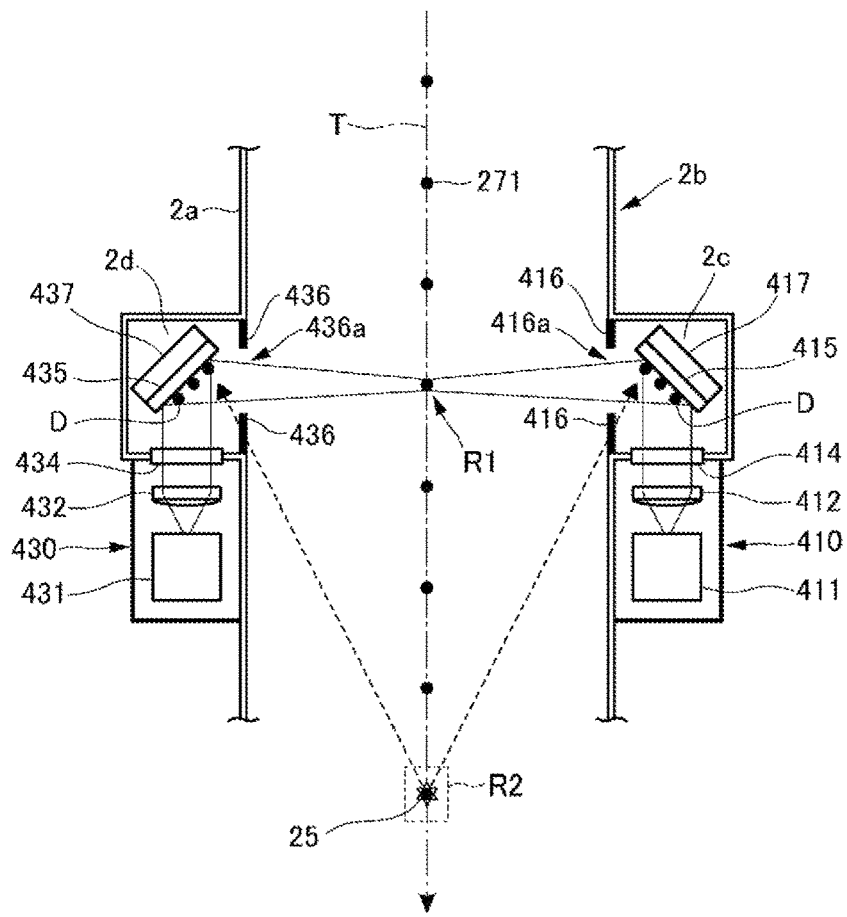
FIG. 11 is a diagram for explaining the configuration of an EUV light generating apparatus according to a sixth embodiment.

FIG. 11 is a diagram for explaining the configuration of the EUV light generating apparatus 1 of the sixth embodiment.

The first tilt stage 417 of the sixth embodiment may include a holder that holds the first mirror 415, and may be a stage that adjusts the orientation of the first mirror 415.

The first tilt stage 417 may adjust the orientation of the first mirror 415 such that the illuminating light which is transmitted through the first window 414 passes through the first region R1.

The first tilt stage 417 may be a manually or automatically driven stage. In the case that the first tilt stage 417 is automatically driven, the driving of the first tilt stage 417 may be controlled by the control unit 51.

Note that the first tilt stage 417 may be a stage that adjusts not only the orientation of the first mirror 415, but also the position of the first mirror 415 as well.

The second tilt stage 437 of the sixth embodiment may include a holder that holds the second mirror 435, and may be a stage that adjusts the orientation of the second mirror 435.

The second tilt stage 437 may adjust the orientation of the second mirror 435 such that the illuminating light which is output to the first region R1 is included in the field of view of the light sensor 431.

The second tilt stage 437 may be a manually or automatically driven stage. In the case that the second tilt stage 437 is automatically driven, the driving of the second tilt stage 437 may be controlled by the control unit 51.

Note that the second tilt stage 437 may be a stage that adjusts not only the orientation of the second mirror 435, but also the position of the second mirror 435 as well.

The other structures of the EUV light generating apparatus 1 of the sixth embodiment may be the same as those of the EUV light generating apparatus 1 of the first embodiment.

[9.2 Operation, Functions, and Effects]

In the EUV light generating apparatus 1 of the sixth embodiment, the first and second mirrors 415 and 435 are capable of appropriately reflecting the illuminating light.

Thereby, the EUV light generating apparatus 1 of the sixth embodiment is capable of suppressing shifting of the optical path of the illuminating light from a desired optical path, and capable of suppressing a decrease in the contrast of the illuminating light which is detected by the light sensor 431.

As a result, the EUV light generating apparatus 1 of the sixth embodiment is capable of improving the detection accuracy of the droplet detector 41.

10. Seventh Embodiment

An EUV light generating apparatus 1 according to a seventh embodiment will be described with reference to FIG. 12.

The EUV light generating apparatus 1 of the seventh embodiment may be of a configuration which is additionally equipped with an illuminating stage 418 and a light receiving stage 438 compared to the EUV light generating apparatus 1 of the sixth embodiment.

Descriptions of the structures of the EUV light generating apparatus 1 of the seventh embodiment which are the same as those of the EUV light generating apparatus 1 of the sixth embodiment will be omitted.

[10.1 Configuration]

Figure 12:
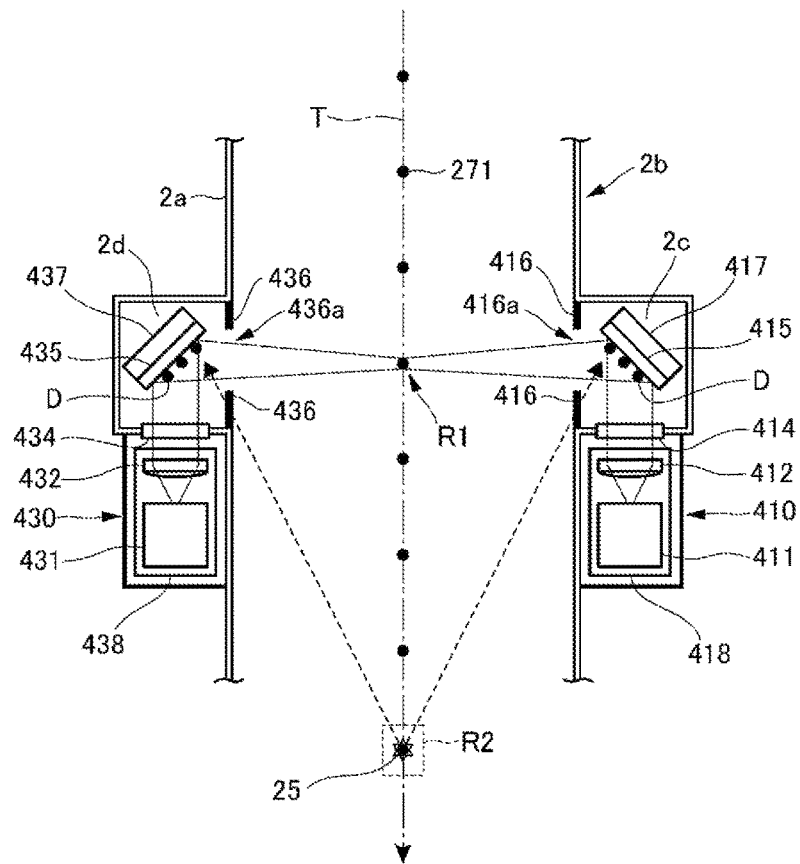
FIG. 12 is a diagram for explaining the configuration of an EUV light generating apparatus according to a seventh embodiment.

FIG. 12 is a diagram for explaining the configuration of the EUV light generating apparatus 1 of the seventh embodiment.

The illuminating stage 418 of the seventh embodiment may include a holder that holds the light source 411 and the illuminating optical system 412, and may be a stage that adjusts at least one of the respective position and orientation of the light source 411 and the illuminating optical system 412.

The illuminating stage 418 may be a stage that adjusts at least one of the respective position and orientation of the light source 411 and the illuminating optical system 412 in at least two rotating directions, about the X axis and the Z axis. The illuminating stage 418 may be a stage that adjusts at least one of the respective position and orientation of the light source 411 and the illuminating optical system 412 in three rotating directions, about the X axis, the Y axis, and the Z axis.

The illuminating stage 418 may adjust at least one of the respective position and orientation of the light source 411 and the illuminating optical system 412 such that the illuminating light which is output from the light source 411 passes through the first region R1 in a predetermined direction. This predetermined direction may be a direction in which the axis of the optical path of the illuminating light that passes through the first region R1 substantially perpendicularly intersects the droplet trajectory T.

The illuminating stage 418 may be a manually or automatically driven stage. In the case that the illuminating stage 418 is automatically driven, the driving of the illuminating stage 418 may be controlled by the control unit 51.

The light receiving stage 438 of the seventh embodiment may include a holder that holds the light sensor 431 and the light receiving optical system 432, and may be a stage that adjusts at least one of the respective position and orientation of the light sensor 431 and the light receiving optical system 432.

The light receiving stage 438 may be a stage that adjusts at least one of the respective position and orientation of the light sensor 431 and the light receiving optical system 432 in at least two rotating directions, about the X axis and the Z axis. The light receiving stage 438 may be a stage that adjusts at least one of the respective position and orientation of the light sensor 431 and the light receiving optical system 432 in three rotating directions, about the X axis, the Y axis, and the Z axis.

The light receiving stage 438 may adjust at least one of the respective position and orientation of the light sensor 431 and the light receiving optical system 432 such that the illuminating light which is output to the first region R1 is included in the field of view of the light sensor 431 and such that the illuminating light enters the light sensor 431 from a predetermined direction. This predetermined direction may be a direction in which the axis of the optical path of the illuminating light that enters the light sensor 431 is substantially perpendicular to the light receiving surface of the light sensor 431.

The light receiving stage 438 may be a manually or automatically driven stage. In the case that the light receiving stage 438 is automatically driven, the driving of the light receiving stage 438 may be controlled by the control unit 51.

The other structures of the EUV light generating apparatus 1 of the seventh embodiment may be the same as those of the EUV light generating apparatus 1 of the sixth embodiment.

[10.2 Operation, Functions, and Effects]

In the EUV light generating apparatus 1 of the seventh embodiment, the light source 411 and the illuminating optical system 412 are capable of appropriately outputting the illuminating light to the first region R1, and the light sensor 431 and the light receiving optical system 432 are capable of causing the illuminating light to appropriately enter the light sensor 431.

Thereby, the EUV light generating apparatus 1 of the seventh embodiment is capable of suppressing shifting of the optical path of the illuminating light from a desired optical path, and capable of suppressing a decrease in the contrast of the illuminating light which is detected by the light sensor 431.

As a result, the EUV light generating apparatus 1 of the seventh embodiment is capable of improving the detection accuracy of the droplet detector 41.

11. Eighth Embodiment

An EUV light generating apparatus 1 according to an eighth embodiment will be described with reference to FIG. 13 and FIG. 14.

The EUV light generating apparatus 1 of the eighth embodiment may differ from the EUV light generating apparatus 1 of the first embodiment mainly in the configuration of the light receiving unit 430. Specifically, the light receiving unit 430 of the eighth embodiment may receive reflected light from the droplet 271.

The reflected light from the droplet 271 may be a portion of the illuminating light which is reflected by the droplet 271 that passes through the first region R1, from the illuminating light which is output from the illuminating unit 410 to the first region R1.

Descriptions of the structures of the EUV light generating apparatus 1 of the eighth embodiment which are the same as those of the EUV light generating apparatus 1 of the first embodiment will be omitted.

[11.1 Configuration]

Figure 13:
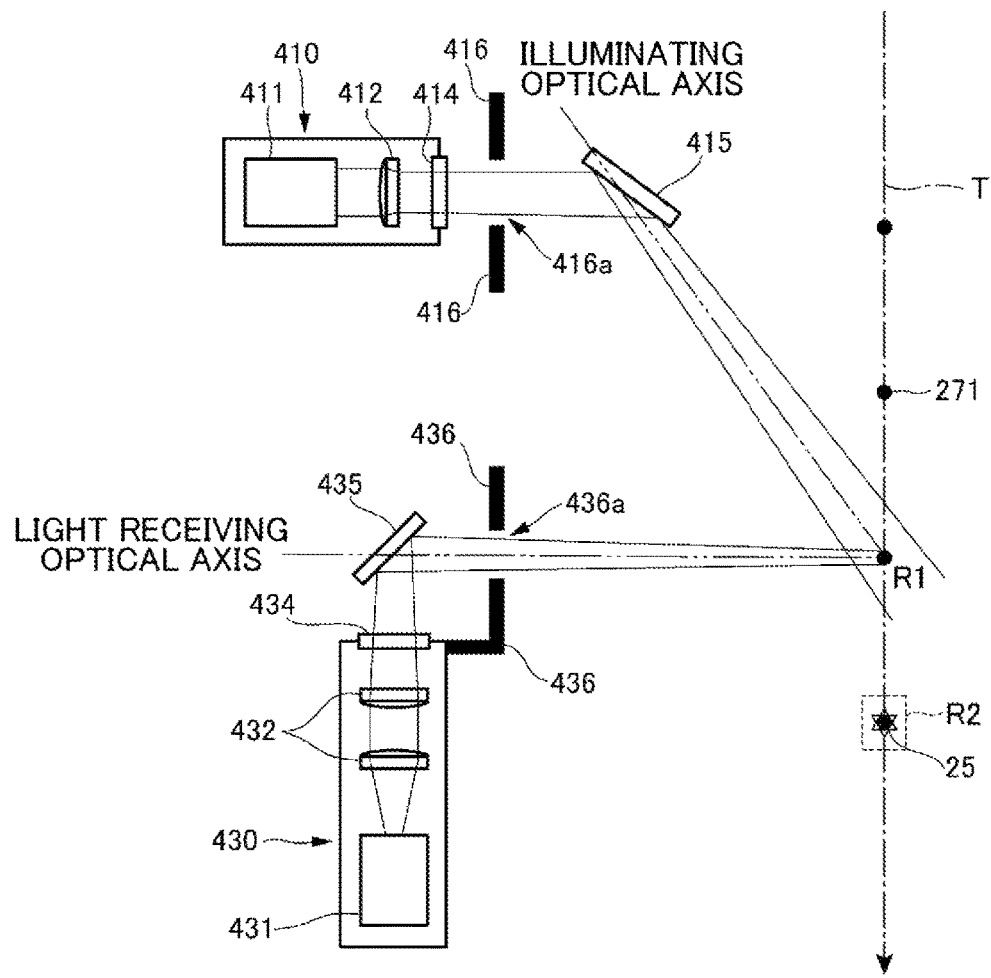
FIG. 13 is a diagram for explaining the configuration of a droplet detector according to an eighth embodiment.

FIG. 13 is a diagram for explaining the configuration of the droplet detector 41 of the eighth embodiment. The wall 2a of the chamber 2 is omitted from FIG. 13. The illuminating unit 410 and the light receiving unit 430 of the eighth embodiment need not be arranged such that they face each other with the first region R1 along the droplet trajectory T interposed therebetween.

The illuminating unit 410 and the light receiving unit 430 of the eighth embodiment may be arranged such that an illuminating optical axis of the illuminating unit 410 and a light receiving optical axis of the light receiving unit 430 pass through the first region R1 from the same side of the first region R1, along directions which are not parallel to each other.

The illuminating optical axis may be the axis of the optical path of the illuminating light which is output from the illuminating unit 410 to the first region R1. In the example illustrated in FIG. 13, the illuminating optical axis may be the axis of the optical path of the illuminating light that propagates from the first mirror 415, which is included in the illuminating unit 410, toward the first region R1.

The light receiving optical axis may be the axis of the optical path of the portion of the illuminating light, which is output from the illuminating unit 410 to the first region R1, that is received by the light receiving unit 430. The light receiving optical axis of the light receiving unit 430 of the eighth embodiment may be the axis of the optical path of the portion of the illuminating light, which is reflected by the droplet 271, that is received by the light receiving unit 430. In the example illustrated in FIG. 13, the light receiving optical axis may be the axis of the reflected light that propagates from the droplet 271 that passes through the first region R1 toward the second mirror 435 included in the light receiving unit 430.

In the example illustrated in FIG. 13, the first mirror 415 is provided closer to the interior of the chamber 2 than the first shielding member 416 is. However, the first mirror 415 may be provided in the interior of the chamber 2 closer to the exterior of the chamber 2 than the first shielding member 416 is. That is, the first mirror 415 of the eighth embodiment may be provided between the first window 414 and the first shielding member 416, along the optical path of the illuminating light, in the same manner as the first embodiment.

The other structures of the EUV light generating apparatus 1 of the eighth embodiment may be the same as those of the EUV light generating apparatus 1 of the first embodiment.

Note that the light sensor 431 of the droplet detector 41 of the eighth embodiment may include an image sensor in the same manner as the droplet detector 41 of the second modification of the first embodiment, and may capture an image of the droplet 271 which has reached the second region R2.

In this case, the illuminating unit 410 and the light receiving unit 430 of the droplet detector 41 of the eighth embodiment may be provided such that the illuminating optical axis and the light receiving optical axis pass through the second region R2.

In addition, in this case, the EUV light generating apparatus 1 of the eighth embodiment may be equipped with a plurality of droplet detectors 41. The plurality of droplet detectors 41 may simultaneously capture images of the droplet 271, which has reached the second region R2, from directions different from each other. The plurality of droplet detectors 41 may measure the position of the droplet 271 which has reached the second region R2 thereby.

[11.2 First Modification]

Figure 14:
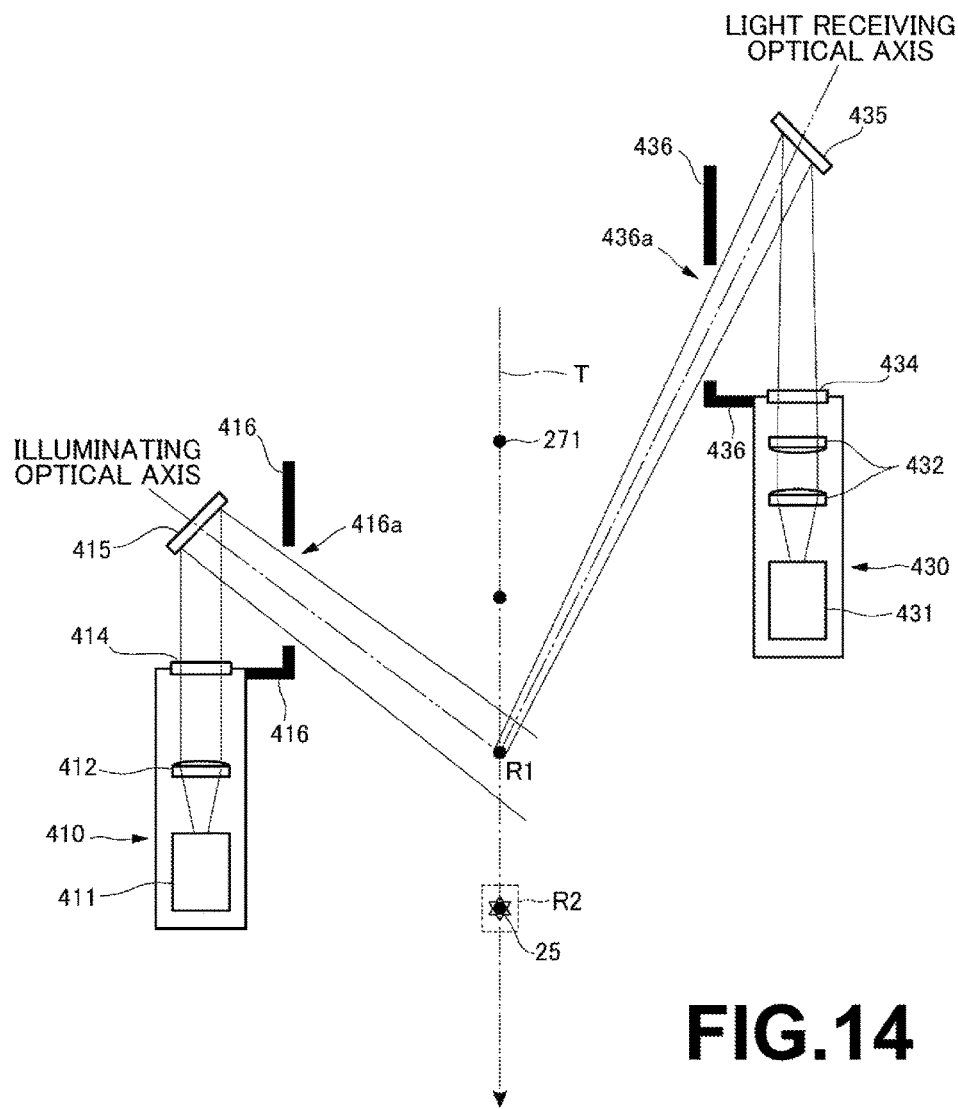
FIG. 14 is a diagram for explaining the configuration of a droplet detector of a first modification of the eighth embodiment.

FIG. 14 is a diagram for explaining the configuration of a droplet detector 41 according to a first modification of the eighth embodiment. The wall 2a of the chamber 2 is not illustrated in FIG. 14.

The light receiving unit 430 of the droplet detector 41 of the first modification of the eighth embodiment may be provided such that the light receiving optical axis extends along the droplet trajectory T.

The droplet detector 41 of the first modification of the eighth embodiment may capture an image of the droplet 271 which has reached the second region R2 in the same manner as the droplet detector 41 of the eighth embodiment.

In this case, the EUV light generating apparatus 1 of the first modification of the eighth embodiment may be equipped with a plurality of droplet detectors 41 in the same manner as the EUV light generating apparatus 1 of the eighth embodiment. The plurality of droplet detectors 41 may simultaneously capture images of the droplet 271, which has reached the second region R2, from directions different from each other. Thereby, the plurality of droplet detectors 41 may measure the position of the droplet 271 which has reached the second region R2 within the XZ plane.

12. Ninth Embodiment

An EUV light generating apparatus 1 according to a ninth embodiment will be described with reference to FIG. 15 and FIG. 16.

The EUV light generating apparatus 1 of the ninth embodiment may differ from the EUV light generating apparatus 1 of the first embodiment mainly in the arrangement of the illuminating unit 410 and the light receiving unit 430.

Descriptions of the structures of the EUV light generating apparatus 1 of the ninth embodiment which are the same as those of the EUV light generating apparatus 1 of the first embodiment will be omitted.

[12.1 Configuration]

Figure 15:
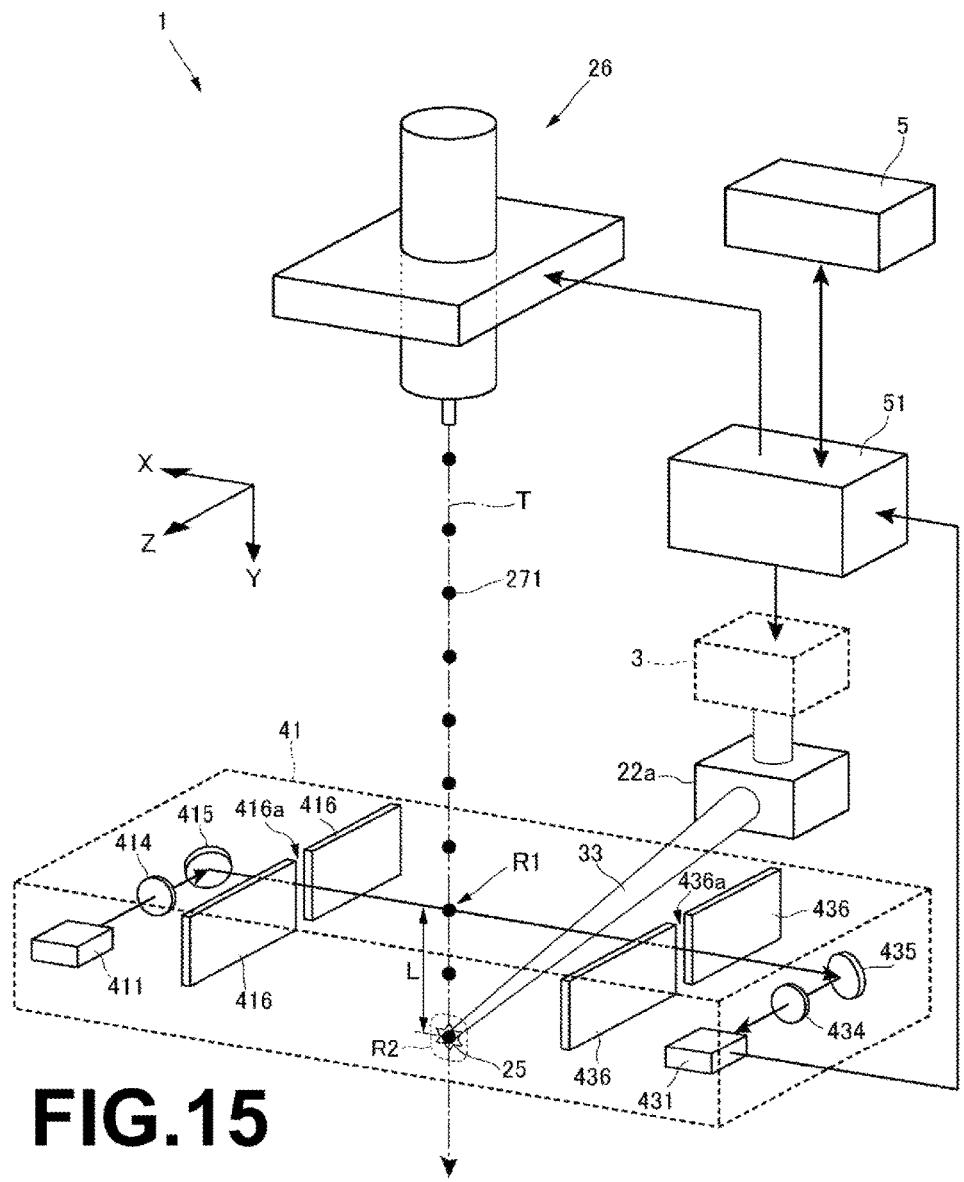
FIG. 15 is a diagram for explaining the configuration of an EUV light generating apparatus according to a ninth embodiment.

FIG. 15 is a diagram for explaining the configuration of the EUV light generating apparatus 1 of the ninth embodiment. The wall 2a of the chamber 2, the illuminating optical system 412, and the light receiving optical system 432 are omitted from FIG. 15.

The illuminating unit 410 of the ninth embodiment may be provided at a position that intersects the plane that intersects the droplet trajectory T and includes the first region R1. That is, the first mirror 415, the first shielding member 416, and additionally the light source 411, the illuminating optical system 412, and the first window 414 of the illuminating unit 410 of the ninth embodiment may be provided at positions that intersect the plane that intersects the droplet trajectory T and includes the first region R1.

Similarly, the light receiving unit 430 of the ninth embodiment may be provided at a position that intersects the plane that intersects the droplet trajectory T and includes the first region R1. That is, the second mirror 435, the second shielding member 436, and additionally the light sensor 431, the light receiving optical system 432, and the second window 434 of the light receiving unit 430 of the ninth embodiment may be provided at positions that intersect the plane that intersects the droplet trajectory T and includes the first region R1.

The plane that intersects the illuminating unit 410 and the light receiving unit 430 may be a plane which is substantially parallel to the XZ plane. A distance L from the plane that intersects the illuminating unit 410 and the light receiving unit 430 to the plasma generating region 25, that is, a distance L between the first region R1 and the plasma generating region 25, may be several millimeters, for example.

The other structures of the EUV light generating apparatus 1 of the ninth embodiment may be the same as those of the EUV light generating apparatus 1 of the first embodiment.

[12.2 First Modification]

Figure 16:
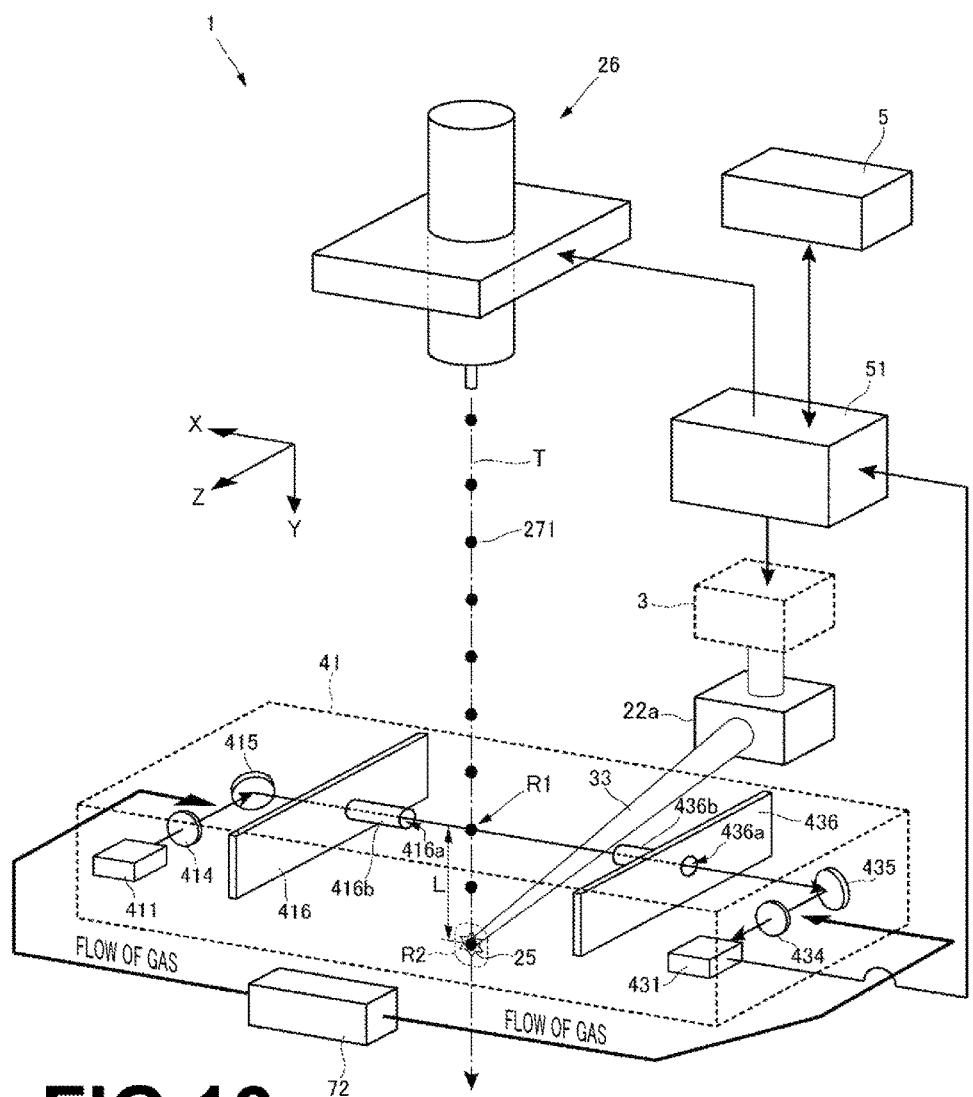
FIG. 16 is a diagram for explaining the configuration of an EUV light generating apparatus according to a first modification of the ninth embodiment.

FIG. 16 is a diagram for explaining the configuration of the EUV light generating apparatus 1 according to a first modification of the ninth embodiment. The wall 2a of the chamber 2, the illuminating optical system 412, and the light receiving optical system 432 are omitted from FIG. 16.

The first shielding member 416 of the first modification of the ninth embodiment may be of a configuration which is additionally equipped with a hollow first cylindrical portion 416b compared to the first shielding member 416 of the ninth embodiment.

The first cylindrical portion 416b may be formed to extend from the peripheral edge of the first opening 416a, which is formed in the first shielding member 416 of the ninth embodiment, toward the first region R1.

The first cylindrical portion 416b may be formed to cover the periphery of the optical path of the illuminating light that passes through the first region R1 and the first opening 416a.

The interior space of the first cylindrical portion 416b may be in communication with the first opening 416a. The interior space of the first cylindrical portion 416b may constitute a portion of the first opening 416a.

The second shielding member 436 of the first modification of the ninth embodiment may be of a configuration which is additionally equipped with a hollow second cylindrical portion 436b compared to the second shielding member 436 of the ninth embodiment.

The second cylindrical portion 436b may be formed to extend from the peripheral edge of the second opening 436a, which is formed in the second shielding member 436 of the ninth embodiment, toward the first region R1.

The second cylindrical portion 436b may be formed to cover the periphery of the optical path of the illuminating light that passes through the first region R1 and the second opening 436a.

The interior space of the second cylindrical portion 436b may be in communication with the second opening 436a. The interior space of the second cylindrical portion 436b may constitute a portion of the second opening 436a.

Note that the EUV light generating apparatus 1 of the first modification of the ninth embodiment may include the first supply port 2e and the second supply port 2f in the chamber 2, and may also include the gas supply apparatus 72, in the same manner as the EUV light generating apparatus 1 of the third embodiment.

The EUV light generating apparatus 1 of the first modification of the ninth embodiment may be configured such that gas supplied from the gas supply apparatus 72 to the first supply port 2e flows along the surface of the first window 414, flows through the interior of the first cylindrical portion 416b, and is ejected from the first opening 416a. In addition, the EUV light generating apparatus 1 of the first modification of the ninth embodiment may be configured such that gas supplied from the gas supply apparatus 72 to the second supply port 2f flows along the surface of the second window 434, flows through the interior of the second cylindrical portion 436b, and is ejected from the second opening 436a.

13. Other Items

[13.1 Other Modifications, Etc.]

It would be clear to those skilled in the art that it is possible to apply the technical features of the embodiments described above, including the modifications thereof, to each other.

For example, the technology of the first through fourth modifications of the first embodiment may be applied to the EUV light generating apparatuses 1 of the second through ninth embodiments.

The technology of the first and second modifications of the fifth embodiment may be applied to the EUV light generating apparatuses 1 of the second through ninth embodiments.

The technology of the second and third embodiments may be applied to the EUV light generating apparatuses 1 of the fourth through ninth embodiments.

The technology of the fourth and fifth embodiments may be applied to the EUV light generating apparatuses 1 of the sixth through ninth embodiments.

The technology of the sixth and seventh embodiments may be applied to the EUV light generating apparatuses 1 of the second through fifth, eighth, and ninth embodiments.

The technology of the eighth embodiment may be applied to the EUV light generating apparatuses 1 of the second through seventh and ninth embodiments.

The technology of the ninth embodiment may be applied to the EUV light generating apparatuses 1 of the second through eighth embodiments.

The above description is not intended to be limiting, but to be exemplary. Accordingly, it would be clear to those skilled in the art that various changes and modifications may be made to the embodiments of the present disclosure without departing from the scopes of the appended claims.

The terms which are employed in the present specification and the appended claims are to be interpreted as "not limiting". For example, the terms "include" and "including" are to be interpreted to mean "including the described elements but not limited thereto". The term "have" is to be interpreted to mean "having the described elements but not limited thereto". Further, the indefinite articles "a" and "an", as well as the word "one" in the present specification as well as the appended claims are to be interpreted to mean "at least one" or "one or more".

What is claimed is:

1. An extreme ultraviolet light generating apparatus, comprising:
   a chamber, in which extreme ultraviolet light is generated by plasma being generated in the interior thereof;
   a window provided in a wall of the chamber;
   a light source provided at the exterior of the chamber, configured to output illuminating light to the interior of the chamber via the window;
   a light sensor provided at the exterior of the chamber, configured to detect the illuminating light which is output to the interior of the chamber via the window;
   a shielding member having an opening that the illuminating light may pass through, that shields the window from emissions from the plasma, and is provided in the interior of the chamber; and
   a mirror provided along an optical path of the illuminating light in the interior of the chamber between the window and the shielding member, having a reflective surface that reflects the illuminating light, the reflective surface being constituted by a surface of a metal layer.

2. The extreme ultraviolet light generating apparatus as defined in claim 1, wherein:
   the window includes at least a first window configured to transmit the illuminating light, which is output from the light source, to the interior of the chamber, and a second window configured to transmit the illuminating light, which is transmitted through the first window and is output to the interior of the chamber;
   the shielding member includes at least a first shielding member, having a first opening configured to pass the illuminating light therethrough, configured to shield the first window from the emissions, and a second shielding member, having a second opening configured to pass the illuminating light therethrough, configured to shield the second window from the emissions; and
   the mirror includes at least a first mirror provided between the first window and the first shielding member and configured to reflect the illuminating light which is transmitted through the first window toward a predetermined region in the interior of the chamber via the first opening, and a second mirror provided between the second window and the second shielding member and configured to reflect the illuminating light which is reflected by the first mirror toward the second window via the second opening.

3. The extreme ultraviolet light generating apparatus as defined in claim 2, wherein:
   the plasma is generated by a target, which is supplied to a plasma generating region in the interior of the chamber, being irradiated with a laser beam;
   the target is formed by a metal material;
   the emissions include at least any of atoms, ions, and clusters of the target;

the first shielding member suppresses adhesion of the emissions onto the first window; and the second shielding member suppresses adhesion of the emissions onto the second window.

4. The extreme ultraviolet light generating apparatus as defined in claim 3, wherein:
a material of the respective metal layer of the first and second mirrors includes the metal material that forms the target.

5. The extreme ultraviolet light generating apparatus as defined in claim 3, further comprising:
a target supply unit provided at the chamber, configured to output the target toward the plasma generating region; wherein:
the predetermined region in the interior of the chamber is positioned between the target supply unit and the plasma generating region; and
the first and second windows are provided closer to the plasma generating region than an axis of an optical path of the illuminating light is, the axis extending between the first mirror and the second mirror and passing through the predetermined region.

6. The extreme ultraviolet light generating apparatus as defined in claim 3, further comprising:
a gas supply apparatus configured to supply a gas having reducing properties with respect to the metal material that forms the target to the interior of the chamber.

7. The extreme ultraviolet light generating apparatus as defined in claim 6, wherein:
the gas supply apparatus supplies the gas to the interior of the chamber from at least one of a first supply port provided in the wall that forms an interior space of the chamber between the first shielding member and the first window, and a second supply port provided in the wall that forms the interior space of the chamber between the second shielding member and the second window.

8. The extreme ultraviolet light generating apparatus as defined in claim 3, further comprising:
a coolant supply apparatus configured to supply a coolant that cools the first and second mirrors to the interiors of the first and second mirrors.

9. The extreme ultraviolet light generating apparatus as defined in claim 8, further comprising:
a temperature adjusting mechanism configured to adjust the temperatures of the first and second mirrors, the temperature adjusting mechanism including the coolant supply apparatus and heaters configured to heat the first and second mirrors which are cooled by the coolant.

10. The extreme ultraviolet light generating apparatus as defined in claim 9, wherein:
the first and second mirrors are respectively constituted by forming the metal layer on a substrate; and
the substrate is formed by a metal material.

11. The extreme ultraviolet light generating apparatus as defined in claim 9, wherein:
the first and second mirrors are respectively constituted by forming the metal layer on a substrate; and
the substrate is formed by a ceramic material.

12. The extreme ultraviolet light generating apparatus as defined in claim 3, further comprising:
a first tilt stage configured to adjust the orientation of the first mirror; and
a second tilt stage configured to adjust the orientation of the second mirror.

13. The extreme ultraviolet light generating apparatus as defined in claim 12, further comprising:
an illuminating stage configured to adjust at least one of the position and the orientation of the light source; and
a light receiving stage configured to adjust at least one of the position and the orientation of the light sensor.

14. The extreme ultraviolet light generating apparatus as defined in claim 3, further comprising:
a target supply unit provided at the chamber, configured to output the target toward the plasma generating region as a droplet; wherein:
the predetermined region in the interior of the chamber is a first region through which the droplet passes, positioned between the target supply unit and the plasma generating region;
the light source outputs the illuminating light so as to illuminate the droplet that passes through the first region; and
the light sensor includes a photodiode array, and detects the illuminating light which is output to illuminate the droplet with the photodiode array to detect the droplet that passes through the first region.

15. The extreme ultraviolet light generating apparatus as defined in claim 14, wherein:
the light sensor detects a portion of the illuminating light that passes the periphery of the droplet that passes through the first region, from the illuminating light which is output to illuminate the droplet.

16. The extreme ultraviolet light generating apparatus as defined in claim 14, wherein:
the light sensor detects a portion of the illuminating light which is reflected by the droplet that passes through the first region, from the illuminating light which is output to illuminate the droplet.

17. The extreme ultraviolet light generating apparatus as defined in claim 3, further comprising:
a target supply unit provided at the chamber, configured to output the target toward the plasma generating region as a droplet; wherein:
the predetermined region in the interior of the chamber is a second region that includes the plasma generating region;
the light source outputs the illuminating light so as to illuminate the droplet that reaches the second region; and
the light sensor includes an image sensor, and detects the illuminating light which is output to illuminate the droplet with the image sensor to capture an image of the droplet which has reached the second region.

* * * * *